United States Patent
Cascio et al.

(10) Patent No.: US 10,122,362 B2
(45) Date of Patent: Nov. 6, 2018

(54) DYNAMIC BIASING CIRCUITRY FOR LEVEL-SHIFTER CIRCUITRY

(71) Applicant: Infineon Technologies Austria AG, Villach (AT)

(72) Inventors: Giacomo Cascio, Villach (AT); Giuseppe Bernacchia, Villach (AT); Adriano Sambucco, Villach (AT)

(73) Assignee: Infineon Technologies Austria AG, Villach (AT)

( * ) Notice: Subject to any disclaimer, the term of this patent is extended or adjusted under 35 U.S.C. 154(b) by 22 days.

(21) Appl. No.: 15/485,044

(22) Filed: Apr. 11, 2017

(65) Prior Publication Data

US 2018/0294813 A1  Oct. 11, 2018

(51) Int. Cl.
*H03K 19/0185* (2006.01)
*H03K 17/567* (2006.01)

(52) U.S. Cl.
CPC ... *H03K 19/018521* (2013.01); *H03K 17/567* (2013.01)

(58) Field of Classification Search
CPC .................. H03K 19/018521; H03K 17/567
USPC ..................................... 327/333; 326/80, 81
See application file for complete search history.

(56) References Cited

U.S. PATENT DOCUMENTS

| | | | |
|---|---|---|---|
| 4,749,884 A * | 6/1988 | Karban ............ | H03K 19/09418 326/30 |
| 5,559,464 A * | 9/1996 | Orii .................. | H03K 3/356113 326/80 |
| 6,099,100 A | 8/2000 | Lee | |
| 7,068,091 B1 * | 6/2006 | Kwong ............. | H03K 19/0013 327/333 |
| 7,710,152 B1 * | 5/2010 | El Bacha ......... | H03K 3/356113 326/68 |
| 7,994,819 B2 | 8/2011 | Al-Shyoukh et al. | |
| 8,643,425 B2 | 2/2014 | Chaudhry et al. | |
| 8,981,831 B1 * | 3/2015 | Kossel ............ | H03K 19/018507 326/68 |
| 9,048,840 B2 * | 6/2015 | Liu .................. | H03K 17/76 |
| 9,466,978 B2 | 10/2016 | Chen et al. | |
| 9,948,291 B1 * | 4/2018 | Weigand ........... | H03K 17/567 |

(Continued)

FOREIGN PATENT DOCUMENTS

CN        102801290 A        11/2012

OTHER PUBLICATIONS

Extended European Search Report and Written Opinion from counterpart European Patent Application No. 18165887.3, dated Aug. 17, 2018, 7 pp.

*Primary Examiner* — Ryan Jager
(74) *Attorney, Agent, or Firm* — Shumaker & Sieffert, P.A.

(57) ABSTRACT

In some examples, a device includes level-shifter circuitry and biasing circuitry including at least four diodes, wherein each diode of the at least four diodes is electrically connected in series. The biasing circuitry further includes push-pull circuitry electrically connected to at least two diodes of the at least four diodes and configured to generate an intermediate voltage signal. The biasing circuitry is configured to deliver a high-side biasing signal to the level-shifter circuitry based on the intermediate voltage signal and a high-side voltage signal from the at least four diodes. The biasing circuitry is further configured to deliver a low-side biasing signal to the level-shifter circuitry based on the intermediate voltage signal and a low-side voltage signal from the at least four diodes.

20 Claims, 15 Drawing Sheets

(56) References Cited

U.S. PATENT DOCUMENTS

| | | | |
|---|---|---|---|
| 2004/0150454 A1* | 8/2004 | Bhattacharya | H03K 3/356113 327/333 |
| 2008/0204109 A1* | 8/2008 | Pilling | H03K 19/0013 327/333 |
| 2012/0274393 A1 | 11/2012 | Ucciardello et al. | |
| 2016/0359483 A1 | 12/2016 | Mukhopadhyay et al. | |
| 2017/0047927 A1* | 2/2017 | Liu | H03K 17/74 |

\* cited by examiner

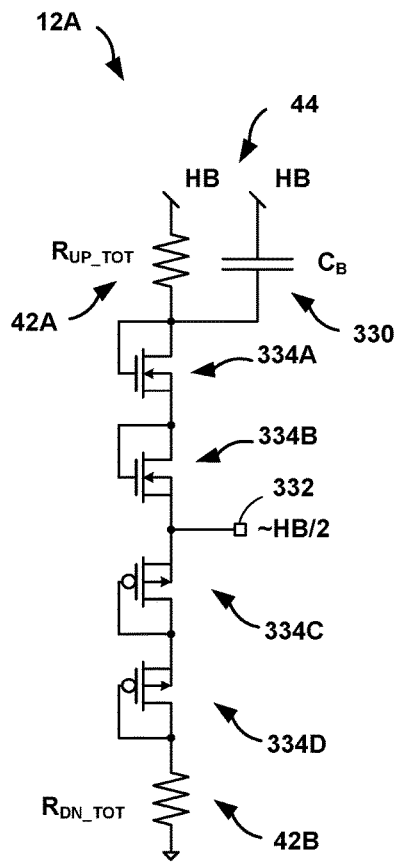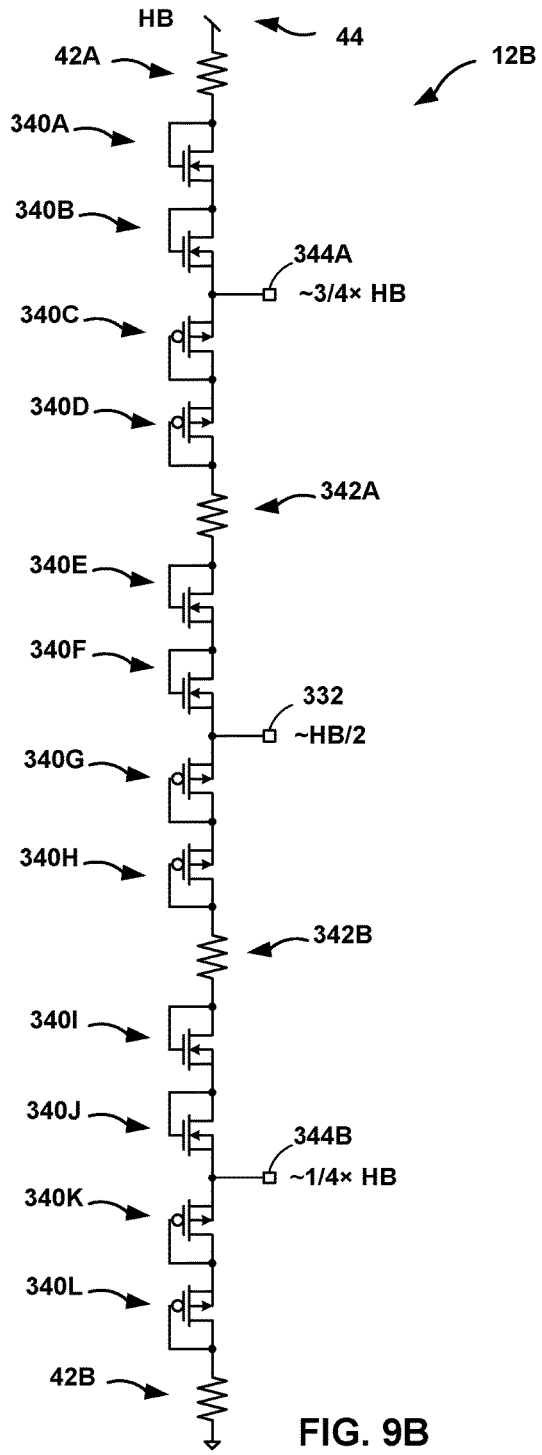
FIG. 9A
FIG. 9B

DYNAMIC BIASING CIRCUITRY FOR LEVEL-SHIFTER CIRCUITRY

TECHNICAL FIELD

This disclosure relates to analog electronic circuitry.

BACKGROUND

Power electronics devices often include a half-bridge arrangement of a high-side power switch, a low-side power switch, and a switch node between the power switches. In some examples, the high-side power switch is an n-type transistor that conducts electricity when the voltage at the control terminal is sufficiently higher (i.e., by a threshold voltage) than the voltage at the switch node. When the high-side power switch conducts electricity, the voltage at the switch node may approach a voltage level of the high-side voltage supply circuitry. In some examples, the voltage level of the high-side voltage supply circuitry may be tens or hundreds of volts higher than the voltage level of the low-side voltage supply circuitry.

The power electronics device may include gate driver circuitry configured to deliver control signals to the control terminal of the high-side power switch. To generate control signals with a voltage level that is higher than the voltage level at the switch node, which may approach the voltage level of the high-side voltage supply circuitry, the gate driver circuitry may receive electricity from floating voltage supply circuitry. The floating voltage supply circuitry may be configured to receive power through a blocking diode configured to conduct electricity from auxiliary voltage supply circuitry. The floating voltage supply circuitry may also be configured to receive power through a bootstrap capacitor configured to conduct high-frequency signals from the switch node to the floating voltage supply circuitry.

In some examples, the gate driver circuitry may be configured to receive shifted control signals from level-shifter circuitry. The level-shifter circuitry may be configured to receive the control signals and generate shifted control signals by increasing the voltage of the control signals while maintaining the information encoded in the control signals. The level-shifter circuitry may be configured to increase the voltage of the control signals based on a voltage of the floating voltage supply circuitry. The gate driver circuitry may be configured to generate and deliver higher-power control signals (i.e. driving signals) to the control terminal of the high-side power switch by increasing the power of the shifted control signals received from the level-shifter circuitry. In some examples, the control signals may include pulse-density modulated (PDM) signals, pulse-width modulated (PWM) signals, pulse frequency modulation (PFM) signals, and/or any other type of control signals.

SUMMARY

This disclosure describes techniques for generating biasing signals for level-shifter circuitry. In some examples, level-shifter circuitry in a power electronics device may experience fast voltage changes when a high-side power switch turns on. Therefore, the biasing circuitry of this disclosure is configured to generate dynamic biasing signals for level-shifter circuitry.

In some examples, a device includes level-shifter circuitry and biasing circuitry including at least four diodes, wherein each diode of the at least four diodes is electrically connected in series. The biasing circuitry further includes push-pull circuitry electrically connected to at least two diodes of the at least four diodes and configured to generate an intermediate voltage signal. The biasing circuitry is configured to deliver a high-side biasing signal to the level-shifter circuitry based on the intermediate voltage signal and a high-side voltage signal from the at least four diodes. The biasing circuitry is further configured to deliver a low-side biasing signal to the level-shifter circuitry based on the intermediate voltage signal and a low-side voltage signal from the at least four diodes.

In some examples, a method for biasing level-shifter circuitry includes delivering a high-side biasing signal to level-shifter circuitry based on an intermediate voltage signal generated by push-pull circuitry electrically connected to at least four diodes, and further based on a high-side voltage signal from the at least four diodes, wherein each diode of the at least four diodes is electrically connected in series. The method further includes delivering a low-side biasing signal to the level-shifter circuitry based on the intermediate voltage signal and a low-side voltage signal from the at least four diodes.

In some examples, a device including a single semiconductor die including half-bridge circuitry including a high-side power switch and a low-side power switch, wherein the high-side power switch and the low-side power switch are electrically connected by a switch node. The single semiconductor die further includes level-shifter circuitry and gate driver circuitry configured to deliver control signals to a control terminal of the high-side power switch based on shifted pulse-width modulated signals received from the level-shifter circuitry. The single semiconductor die also includes biasing circuitry including at least four diodes, wherein each diode of the at least four diodes is electrically connected in series. The biasing circuitry further includes a high-side capacitor, a low-side capacitor, and push-pull circuitry electrically connected to at least two diodes of the at least four diodes and configured to deliver an intermediate voltage signal to the high-side capacitor and the low-side capacitor. The biasing circuitry is configured to deliver a high-side biasing signal to the level-shifter circuitry based on the intermediate voltage signal delivered to the high-side capacitor and further based on a high-side voltage signal from the at least four diodes. The biasing circuitry is further configured to deliver a low-side biasing signal to the level-shifter circuitry based on the intermediate voltage signal delivered to the low-side capacitor and further based on a low-side voltage signal from the at least four diodes.

The details of one or more examples are set forth in the accompanying drawings and the description below. Other features, objects, and advantages will be apparent from the description and drawings, and from the claims.

BRIEF DESCRIPTION OF DRAWINGS

FIGS. 9A and 9B are circuit diagrams of example diodes of the biasing circuitry of FIGS. 1-3 and 7, in accordance with some examples of this disclosure.

DETAILED DESCRIPTION

Figure 1:
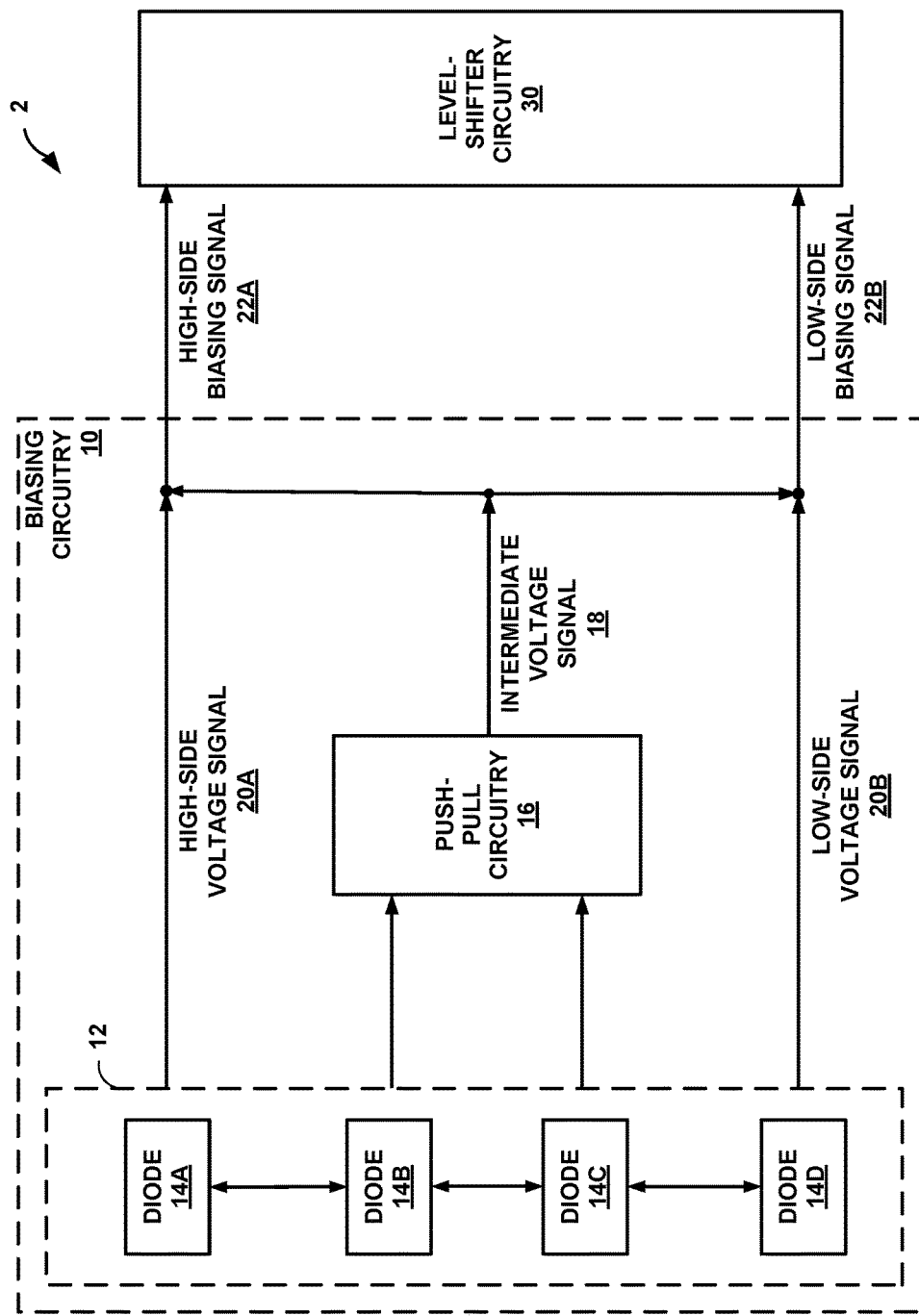
FIG. 1 is a conceptual block diagram of a device including biasing circuitry configured to deliver biasing signals to level-shifter circuitry, in accordance with some examples of this disclosure.

Biasing circuitry may be configured to deliver a high-side biasing signal and a low-side biasing signal to level-shifter circuitry. The devices of the level-shifter circuitry may experience increased voltage stress during higher-frequency changes in voltage. To prevent breakdown of the devices of the level-shifter circuitry, biasing circuitry of this disclosure may be responsive to changes in the voltage level of a floating voltage supply circuitry. The biasing circuitry of this disclosure may deliver biasing signals that are responsive to the changes in the voltage level of the floating voltage supply circuitry, such that the voltage stress on the devices of the level-shifter circuitry is reduced.

The biasing circuitry of this disclosure may include at least four diodes connected in series and push-pull circuitry configured to generate an intermediate voltage signal. The biasing circuitry may deliver the high-side biasing signal and the low-side biasing signal to level-shifter circuitry based on the intermediate voltage signal. In some examples, the biasing circuitry may include direct-current (DC) blocking capacitors to allow higher-frequency changes in the intermediate voltage signal to affect the high-side biasing signal and the low-side biasing signal.

The biasing circuitry of this disclosure may have modularity, such that the biasing circuitry may be expanded to deliver a second high-side biasing signal and a second low-side biasing signal to a second level-shifter circuit. In addition, the intermediate voltage signal generated by the push-pull circuitry may be applied to two blocking diodes connected in series to prevent breakdown of the blocking diodes.

The biasing circuitry may improve the operation of level-shifter circuitry that is configured to translate control signals from a lower-voltage domain, such as a digital domain, to a supply-voltage domain of high-side gate driver circuitry. The supply-voltage domain may be static or dynamic. A dynamic supply-voltage domain for high-side gate driver circuitry may include floating voltage supply circuitry with a voltage level that may exceed the voltage level of a high-side voltage supply circuitry. When the voltage level of the floating voltage supply circuitry increases above the voltage level of the high-side voltage supply circuitry, the devices of the level-shifter circuitry may be at a higher risk of breaking down. To reduce the likelihood of breakdown, the biasing circuitry of this disclosure may deliver biasing signals that are responsive to changes in the voltage levels of the level-shifter circuitry and the floating voltage supply circuitry.

The techniques of this disclosure may improve the operation of high-speed applications, where propagation delays and reliable switching performance are important. High-speed applications may experience faster slew rates, such that the slew rates of the biasing signals delivered by the biasing circuitry may be important. Biasing circuitry that is responsive to changes in voltage levels may reduce the likelihood of device breakdown.

FIG. 1 is a conceptual block diagram of a device 2 including biasing circuitry 10 configured to deliver biasing signals 22A and 22B to level-shifter circuitry 30, in accordance with some examples of this disclosure. Device 2 may be a power electronics device, an analog electrical device, an embedded system, an integrated circuit (IC) device, a power conversion device, a motor driver circuit, and/or any other electrical device. In some examples, device 2 may include gate-driver circuitry configured to receive control signals from level-shifter circuitry 30. The gate-driver circuitry may be configured to deliver driving signals to power switches of a half-bridge circuit and/or an H-bridge circuit based on the control signals received from level-shifter circuitry 30. In some examples, the half-bridge circuit and/or an H-bridge circuit of device 2 may be configured to drive an electrical load such as an electrical circuit, an electronic device, an electric motor, a light-producing device, a sound-producing device, and/or any other electrical load. In some examples, device 2 may include charge pump circuitry and/or a switched capacitor power supply.

In some examples, device 2 may be a power conversion device, such as an alternating-current-to-direct-current (AC/DC) converter, an AC/AC converter, or a DC/DC converter. Device 2 may include two power switches arranged as a half-bridge circuit and configured to generate an output signal at a switch node that is positioned between the two power switches. In some examples, device 2 may be a multiphase power converter and may include two or more half-bridge circuits or two or more H-bridge circuits. Each power switch of device 2 may include a sensing switch that includes one or more modules of device 2, where device 2 may include numerous modules (i.e., cells or transistors) and each power switch includes two or more modules connected in parallel. In some examples, device 2 may operate as a buck converter, a boost converter, a buck-boost converter, a flyback converter, a resonant mode converter such as an LLC converter, and/or a multiphase power converter.

Biasing circuitry 10 includes diodes 12 and push-pull circuitry 16. Biasing circuitry is configured to deliver high-side biasing signal 22A and low-side biasing signal 22B to level-shifter circuitry 30. Biasing signals 22A and 22B may control the flow of electricity through the devices of level-shifter circuitry 30. Thus, biasing circuitry 10 may be configured to control the operation of level-shifter circuitry 30.

Diodes 12 includes at least four diodes 14A-14D that are electrically connected in series. Diode 14A may be configured to deliver high-side voltage signal 20A and low-side voltage signal 20B. In some examples, each of diodes 14A-14D may include a diode-connected transistor, which is a transistor with a load terminal that is electrically connected to a control terminal of the transistor. Each of diodes 14A . . . 14D may include a transistor such as, but not limited to, any type of field-effect transistor (FET) such as a metal-oxide-semiconductor FET (MOSFET), a bipolar junction transistor (BJT), an insulated-gate bipolar transistor (IGBT), a high-electron-mobility transistor (HEMT) such as a silicon carbide (SiC) based transistor or a gallium-nitride (GaN) based transistor, a silicon based transistor, or another element that uses voltage for its control. Each of diodes 14A-14D may include n-type transistors, p-type transistors, or other analog devices such as diodes and/or thyristors.

Push-pull circuitry 16 is configured to generate intermediate voltage signal 18. Push-pull circuitry 16 may include two or more switches that alternately supply current to, or absorb current from, an output node, also known as a switch node. In some examples, push-pull circuitry 16 may include a class AB amplifier or class AB output stage circuitry. Push-pull circuitry 16 may be electrically connected to floating voltage supply circuitry (not shown in FIG. 1) on a high-voltage side of push-pull circuitry 16. Push-pull circuitry 16 may be electrically connected to low-side voltage supply circuitry (not shown in FIG. 1) on a low-voltage side of push-pull circuitry 16. The voltage level of intermediate voltage signal 18 may be approximately halfway between the voltage levels of the floating voltage supply circuitry and the low-side voltage supply circuitry.

Level-shifter circuitry 30 is configured to receive biasing signals 22A and 22B. Level-shifter circuitry 30 may include devices such as transistors that are connected in series. The control terminals of the devices of level-shifter circuitry 30 may be configured to receive biasing signals 22A and 22B. Level-shifter circuitry 30 may be configured to translate control signals such as pulse-density modulated (PDM) signals from a lower-voltage domain to a higher-voltage domain.

In accordance with the techniques of this disclosure, biasing circuitry 10 is configured to deliver high-side biasing signal 22A to level-shifter circuitry 30 based on intermediate voltage signal 18 and high-side voltage signal 20A. Biasing circuitry 10 is further configured to deliver low-side biasing signal 22B to level-shifter circuitry 30 based on intermediate voltage signal 18 and low-side voltage signal 20B. Biasing circuitry 10 may be configured to respond quickly to changes in a supply voltage, such that the devices of level-shifter circuitry 30 may be less likely to break down. During transient conditions in the floating voltage supply circuitry, which may include fast increases in voltage level, biasing signals 22A and 22B may cause the devices of level-shifter circuitry 30 to conduct electricity to reduce voltage stress across the devices. Thus, in some examples, biasing circuitry 10 and of level-shifter circuitry 30 may operate with greater stability, faster response times, and reduced voltage stress.

In some examples, biasing circuitry 10 may be configured to deliver additional biasing signals to level-shifter circuitry for another electrical load. The components of biasing circuitry 10, such as diodes 12, may be configured to generate voltage signals that can be used to deliver additional biasing signals (see FIG. 13). In some examples, biasing circuitry 10 may also be configured to deliver intermediate voltage signal 18 to an intermediate node of blocking circuitry that is electrically connected to the floating voltage supply circuitry.

As compared to other devices, device 2 may experience more reliable operation because of biasing signals 22A and 22B. In some examples, device 2 may include no extra pins or external connections beyond the pins and connections for another device. Device 2 may have high sinking/sourcing alternating-current (AC) current capability and high-speed operation. The configuration of biasing circuitry 10 may reduce or eliminate stability problems. Biasing circuitry 10 may offer high modularity and may reduce the voltage stress on blocking diodes and the chain of switches in level-shifter circuitry 30.

Figure 2:
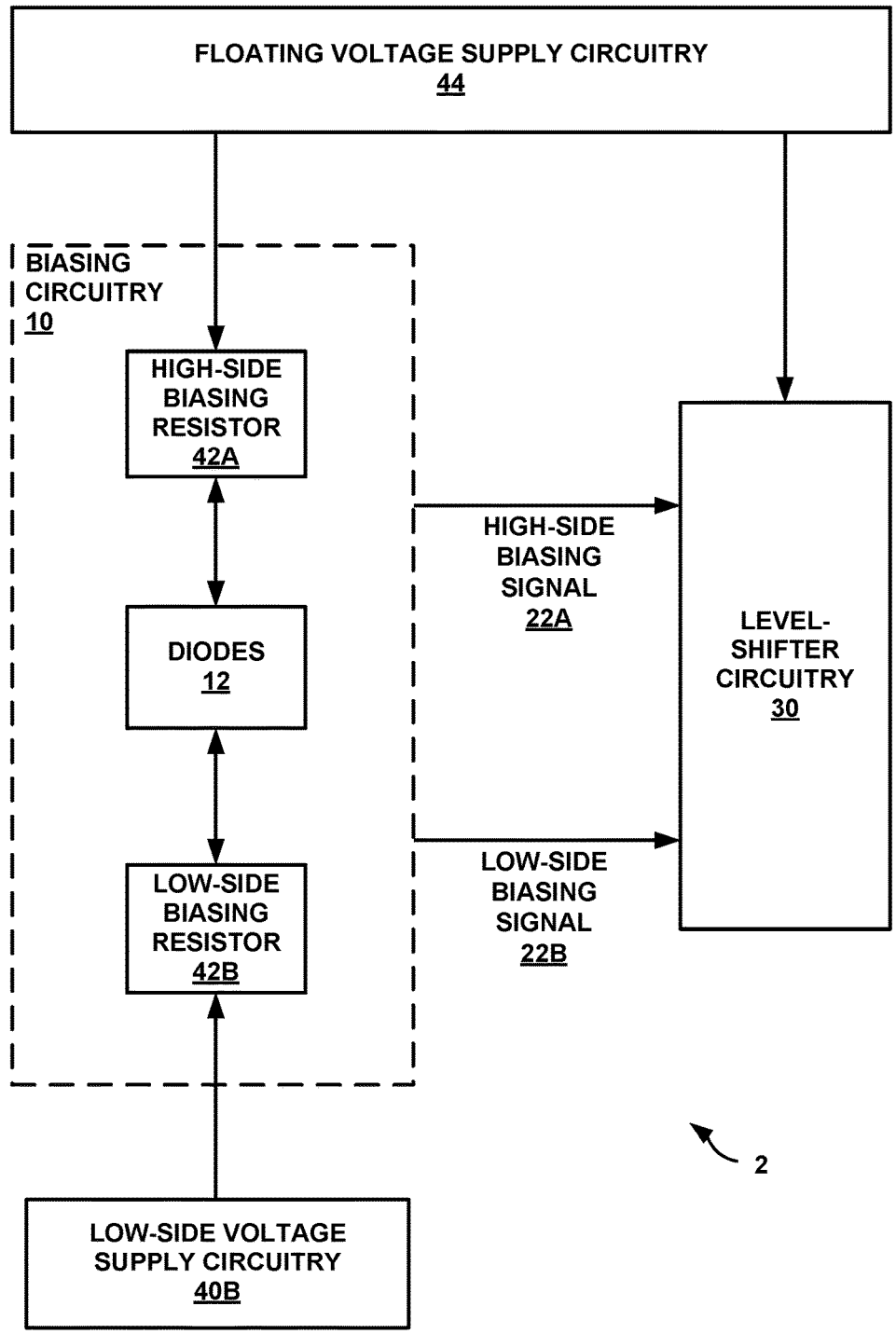
FIG. 2 is a conceptual block diagram of an example configuration of the device of FIG. 1 further including voltage supply circuitry, in accordance with some examples of this disclosure.

FIG. 2 is a conceptual block diagram of an example configuration of device 2 further including voltage supply circuitry 40B and 44, in accordance with some examples of this disclosure. Device 2 may include voltage supply circuitry 40B and 44 and biasing resistors 42A and 42B. High-side biasing resistor 42A may be electrically connected in series between floating voltage supply circuitry 44 and diodes 12, such that there is a voltage drop between floating voltage supply circuitry 44 and diodes 12 when current flows through biasing resistor 42A. Low-side biasing resistor 42B may be electrically connected in series between diodes 12 and low-side voltage supply circuitry 40B, such that there is a voltage drop when current flows through biasing resistor 42B. Each of biasing resistors 42A and 42B may include one or more resistors connected in series and/or parallel.

Floating voltage supply circuitry 44 may be configured to deliver electrical power to level-shifter circuitry 30 and high-side biasing resistor 42A. Floating voltage supply circuitry 44 may operate as a high-side voltage rail or power supply for biasing circuitry 10, level-shifter circuitry 30, and high-side driver circuitry (not shown in FIG. 2). Floating voltage supply circuitry 44 may be configured to float at a voltage level that is higher than high-side voltage supply circuitry (not shown in FIG. 2) when a high-side power switch is active. Low-side voltage supply circuitry 40B may be configured to deliver a reference voltage, such as a reference ground voltage, to low-side biasing resistor 42B. In some examples, low-side voltage supply circuitry 40B may be known as the ground rail or the ground supply.

The voltage supply circuitries of this disclosure, such as high-side voltage supply circuitry (not shown in FIG. 2), low-side voltage supply circuitry 40B, floating voltage supply circuitry 44, and auxiliary voltage supply circuitry 48, and/or any other voltage supply circuitry may include electrically conductive components. These components may include conductive material such as metal, semiconductors, and/or other conductive material. The voltage supply circuitry may include wires, traces and vias in a printed circuit board (PCB), leadframe, highly doped semiconductors, and so on. In some examples, the voltage supply circuitry may also include passive components such as resistors, capacitors, inductors, and diodes, and active components such as transistors.

Each of biasing resistors 42A and 42B may include one or more resistors connected in series and/or parallel. A portion of the voltage difference between voltage supply circuitry 40B and 44 may be dropped across each of diodes 12 and biasing resistors 42A and 42B. By dropping a portion of the voltage difference across each of diodes 12 and biasing resistors 42A and 42B, biasing circuitry 10 may generate intermediate voltage signal 18 and deliver biasing signals 22A and 22B at suitable voltage levels.

Figure 3:
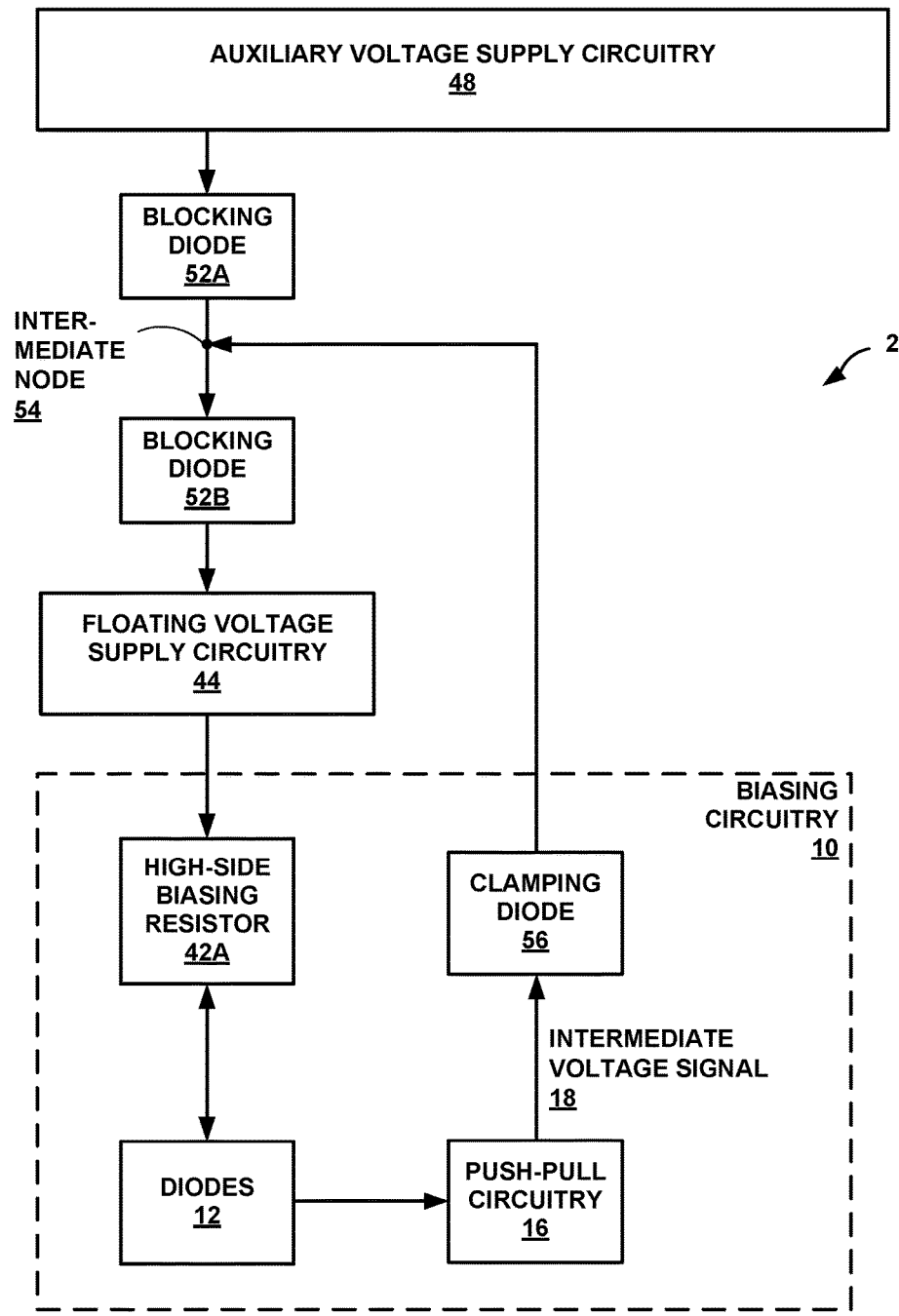
FIG. 3 is a conceptual block diagram of an example configuration of the device of FIGS. 1 and 2 further including at least two blocking diodes, in accordance with some examples of this disclosure.

FIG. 3 is a conceptual block diagram of an example configuration of device 2 further including at least two blocking diodes 52A and 52B, in accordance with some examples of this disclosure. Blocking diodes 52A and 52B may be electrically connected in series between auxiliary voltage supply circuitry 48 and floating voltage supply circuitry 44. Blocking diodes 52A and 52B may be configured to deliver a voltage signal from the auxiliary voltage supply circuitry 48 to floating voltage supply circuitry 44.

In some examples, the voltage level of floating voltage supply circuitry 44 may be approximately equal to the voltage level of auxiliary voltage supply circuitry 48 when blocking diodes 52A and 52B are conducting electricity. Each of blocking diodes 52A and 52B may have a voltage drop, such as approximately seven hundred millivolts, when conducting electricity. A voltage difference between intermediate voltage signal 18 and low-side voltage supply circuitry 40B may be approximately one-half of the voltage difference between floating voltage supply circuitry 44 and low-side voltage supply circuitry 40B. "Approximately one-half," as used herein, may mean that the voltage difference between intermediate voltage signal 18 and low-side voltage supply circuitry 40B is greater than forty percent and less than sixty percent of the voltage difference between floating voltage supply circuitry 44 and low-side voltage supply circuitry 40B.

The voltage level of floating voltage supply circuitry 44 may be higher than the voltage level of auxiliary voltage supply circuitry 48 when blocking diodes 52A and 52B are not conducting electricity. Floating voltage supply circuitry 44 may receive electrical power from a switch node of half-bridge circuitry (not shown in FIG. 3) through a bootstrap capacitor (see FIGS. 5 and 6) during an active period of high-side power switch.

In some examples, device 2 may include more than two blocking diodes electrically connected in series. The voltage drop across each of the blocking diodes may be approximately equal to the voltage difference between auxiliary voltage supply circuitry 48 and floating voltage supply circuitry 44 divided by the number of blocking diodes. Intermediate node 54 may include a voltage level that is approximately halfway between the voltage of auxiliary voltage supply circuitry 48 and the voltage of floating voltage supply circuitry 44. In some examples, the voltage level at intermediate node 54 may be closer to the voltage level of auxiliary voltage supply circuitry 48 or to the voltage level of floating voltage supply circuitry 44. In such examples, the voltage drop across one of blocking diodes 52A and 52B may be larger than the voltage drop across the other diode of blocking diodes 52A and 52B. The blocking diode with the higher voltage drop may be at risk of breakdown.

To reduce the likelihood of breakdown of one or both of blocking diodes 52A and 52B, push-pull circuitry 16 may be configured to deliver intermediate voltage signal 18 through clamping diode 56 to intermediate node 54, which may be a high-impedance node due to the characteristics of blocking diodes 52A and 52B. In some examples, intermediate voltage signal 18 may have a voltage level that is approximately halfway between the voltage level of floating voltage supply circuitry 44 and the voltage level of auxiliary voltage supply circuitry 48. Thus, clamping diode 56 may be configured to conduct electricity to intermediate node 54 when the voltage level at intermediate node 54 falls below the voltage level of intermediate voltage signal 18.

This arrangement may reduce the likelihood of one of blocking diodes 52A and 52B breaking down. The arrangement may also quickly recharge a bootstrap capacitor electrically connected in parallel with high-side biasing resistor 42A. In some examples, the size of clamping diode 56 may be smaller than the sizes of blocking diodes 52A and 52B.

Figure 4:
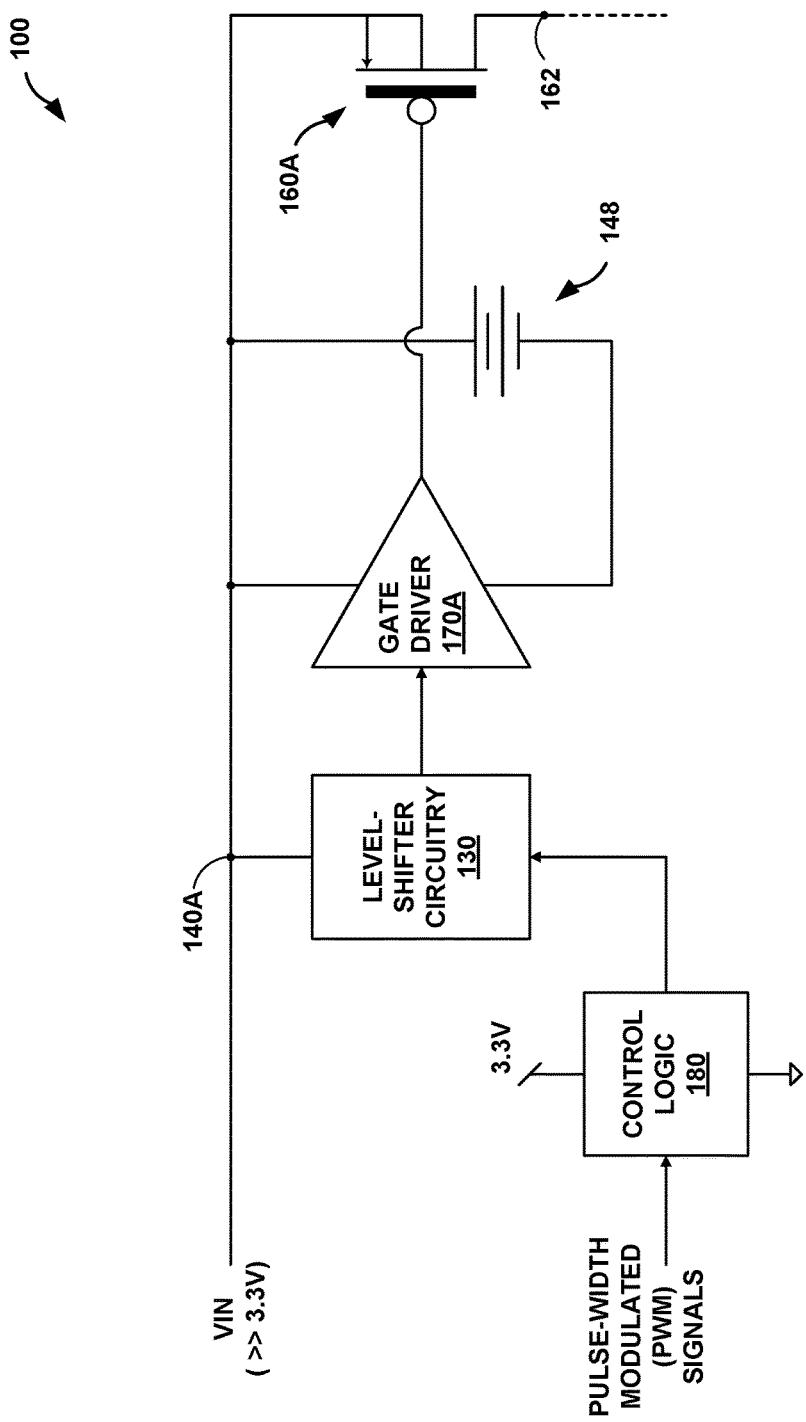
FIGS. 4-6 are conceptual block and circuit diagrams of circuitry configured to control a high-side power switch.
Figure 5:
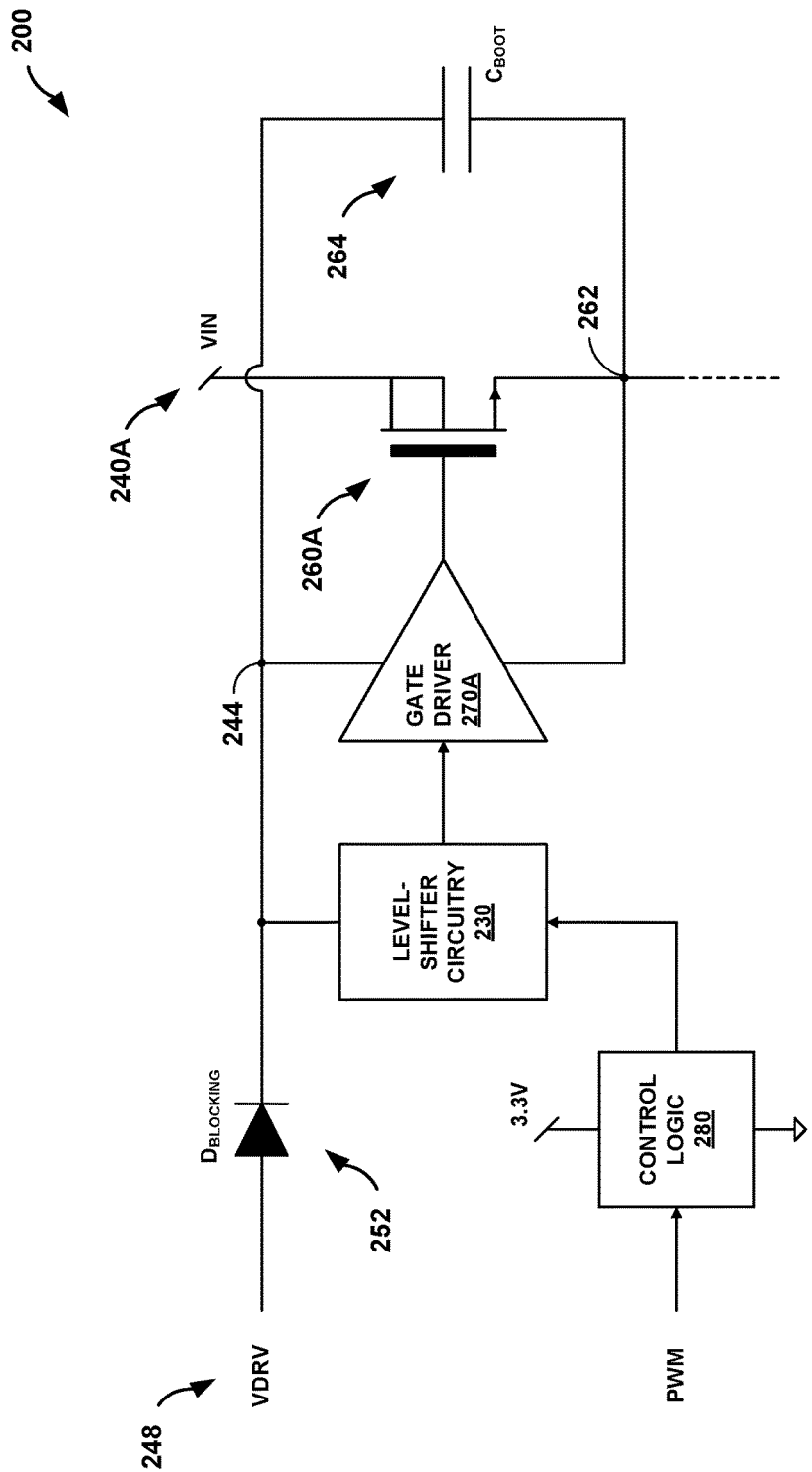
Figure 6:
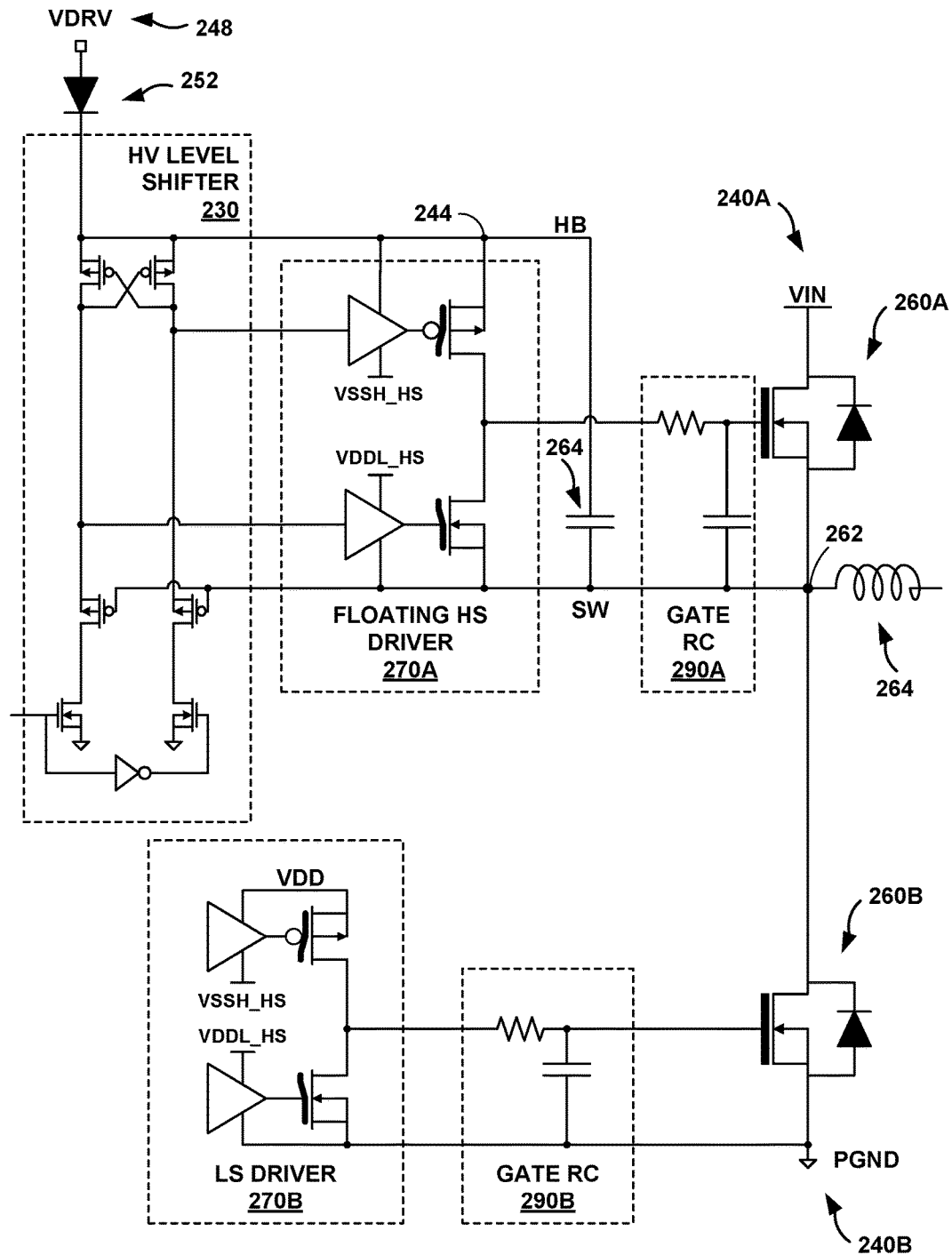

FIGS. 4-6 are conceptual block and circuit diagrams of circuitry configured to control a high-side power switch 160A or 260A. Switch nodes 162 or 262 may be a common node between the high-side power switch 160A or 260A and low-side power switch 260B. An electrical load may be electrically connected to switch node 162 or 262. In some examples, an inductor may be electrically connected between switch node 162 or 262 and the electrical load. In some examples, the components of devices 100 and 200 may be integrated into a single device or semiconductor die. The components of devices 100 and 200 may also be a part of separate devices. For example, power switches 260A and 260B may be discrete or integrated into a single die. Gate drivers 270A and 270B may be a separate device or integrated with one or more of level-shifter circuitry 230, power switches 260A and 260B, and/or inductor 264.

Each of high-side power switches 160A and 260A may be a FET, a GaN device, and/or any other power switch. High-side power switch 160A may be a p-channel transistor, and power switches 260A and 260B may be n-channel transistors. For example, an n-channel transistor will conduct electricity when the voltage level at the control terminal is sufficiently higher than the voltage level at the lower load terminal. When high-side power switch 160A or 260A is conducting electricity, the voltage level at switch node 162 or 262 may approach the voltage level of the high-side voltage supply circuitry 140A or 240A. When low-side power switch 260B is conducting electricity, the voltage level at switch node 162 or 262 may approach the voltage level of the low-side voltage supply circuitry 240B.

Device 100 may include static high-side voltage supply circuitry. Gate driver 170A may be configured to drive high-side power switch 160A by delivering control signals to a control terminal of high-side power switch 160A. The high-side power supply node of gate driver 170A is electrically connected to high-side voltage supply circuitry 140A. The low-side power supply node of gate driver 170A may be referenced to high-side voltage supply circuitry 140A by reference voltage 148.

Device 200 may include half-bridge circuitry including high-side power switch 260A and low-side power switch 260B. Switch node 262 may be electrically connected between high-side power switch 260A and low-side power switch 260B. Device 200 further includes gate driver circuitry 270A that may be configured to deliver control signals to a control terminal of high-side power switch 260A based on shifted pulse-width modulated (PWM) signals received from level-shifter circuitry 30. Although FIGS. 4, 5, 7, and 8 depict PWM signals, in some examples, the PWM signals may additionally or alternatively be pulse-density modulated (PDM) signals and/or any other suitable control signals.

Device 200 may include a single semiconductor die made of silicon, silicon carbide, gallium nitride, and/or any other suitable semiconductor material. The single semiconductor die may include power switches 260A and 260B, gate drivers 270A and 270B, level-shifter circuitry 30, and/or biasing circuitry 10. In some examples, one or more of these components may be located in a separate semiconductor die.

Device 200 may include floating voltage supply circuitry 244. The low-side power supply node of gate driver 270A may be electrically connected to switch node 262. The high-side power supply node of gate driver 270A may be electrically connected to floating voltage supply circuitry 244 instead of high-side voltage supply circuitry 240A. Floating voltage supply circuitry 244 may be configured to receive electrical power from auxiliary voltage supply circuitry 248 (VDRV) through blocking diode 252 or a switch with blocking capability.

Bootstrap capacitor 264 may be electrically connected between floating voltage supply circuitry 244 and switch node 262. When high-side power switch 260A turns on, bootstrap capacitor 264 may be configured to deliver a signal to floating voltage supply circuitry 244 to increase the voltage level of floating voltage supply circuitry 244 above the voltage level of high-side voltage supply circuitry 240A. When low-side power switch 260B turns on, bootstrap capacitor 264 may be configured to deliver a signal to floating voltage supply circuitry 244 to decrease the voltage level of floating voltage supply circuitry 244. The voltage level at switch node 262 may approach the voltage level of low-side voltage supply circuitry 240B, and bootstrap capacitor 264 may be recharged from auxiliary voltage supply circuitry 248 through blocking diode 252. When high-side power switch 260A turns on later, the voltage level at switch node 262 may approach the voltage level of high-side voltage supply circuitry 240A, and blocking diode 252 is reverse-biased (i.e., inactive). Thus, when high-side power switch 260A is active, bootstrap capacitor 264 "floats" at a voltage level that may be higher than the voltage level of high-side voltage supply circuitry 240A.

Figure 7:
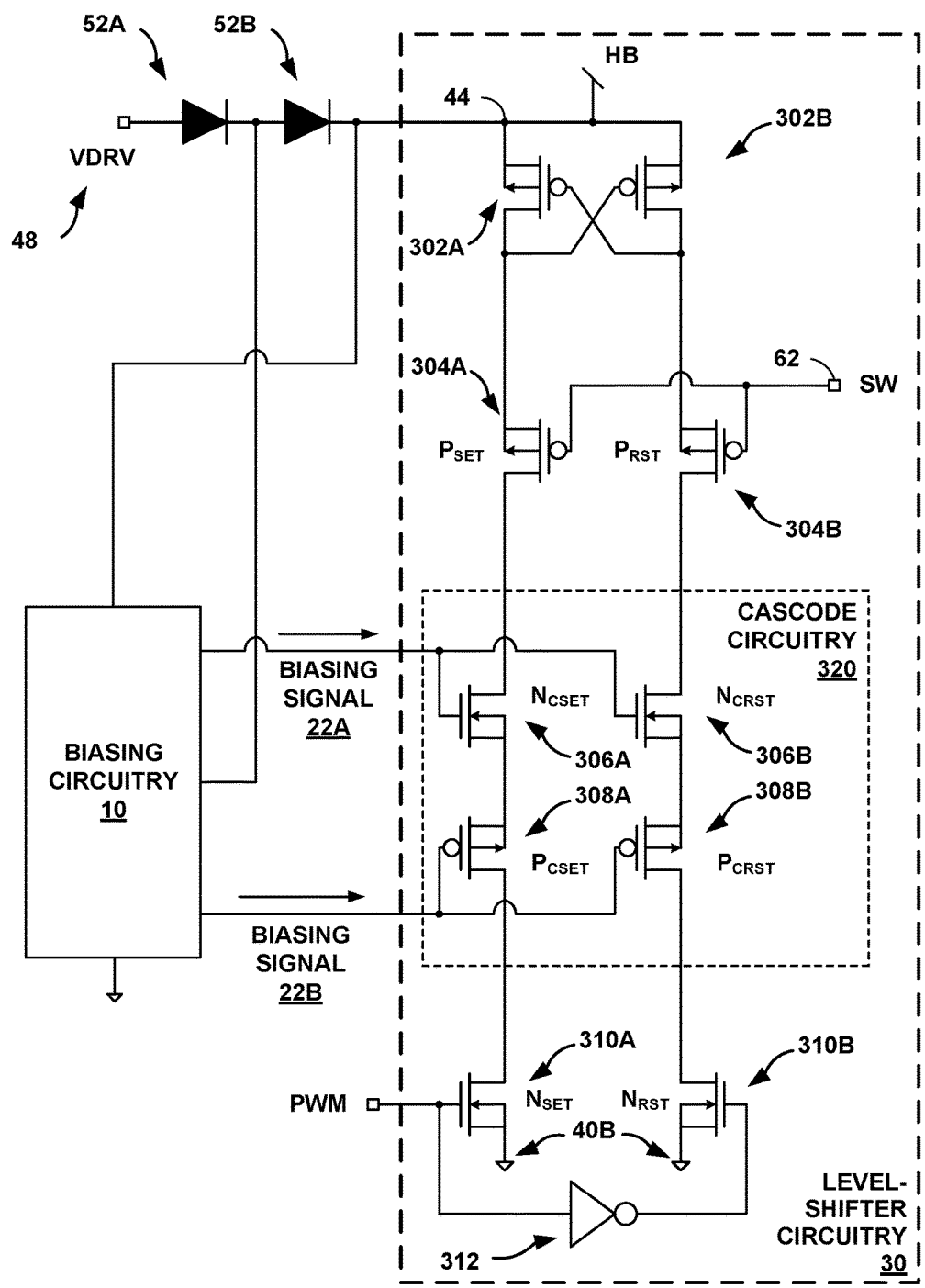
FIG. 7 is a conceptual block and circuit diagram of an example configuration of the device of FIGS. 1-3 further including cascode circuitry of the level-shifter circuitry, in accordance with some examples of this disclosure.

In some examples, gate driver 270A may be exposed to the voltage difference between floating voltage supply circuitry 244 and switch node 262. Blocking diode 252 may be exposed to the voltage difference between auxiliary voltage supply circuitry 248 and floating voltage supply circuitry 244, which may be relatively large if the auxiliary voltage is lower, such as three volts or five volts, and the floating voltage is higher, such as one hundred volts. Therefore, the breakdown voltage threshold of blocking diode 252 may be important. Furthermore, level-shifter circuitry 230 may be exposed to the voltage difference between floating voltage supply circuitry 244 and low-side voltage supply circuitry 240B, which may be relatively large. FIG. 7 shows one configuration for level-shifter circuitry to withstand a larger voltage difference.

Figure 8:
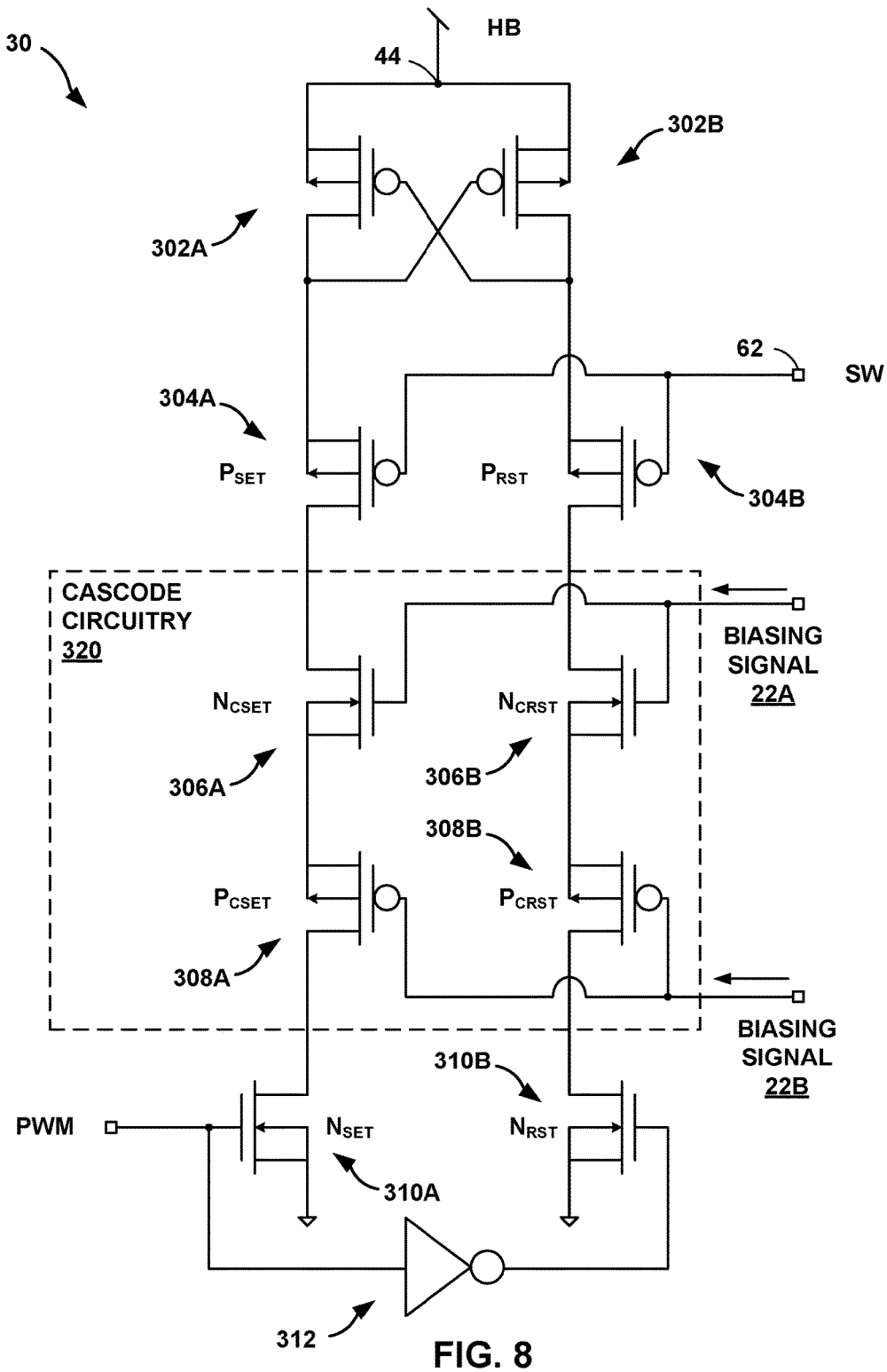
FIG. 8 is a circuit diagram of example level-shifter circuitry of the device of FIGS. 1-3 and 7, in accordance with some examples of this disclosure.

FIGS. 7 and 8 are conceptual block and circuit diagrams of an example configuration of device 2 further including cascode circuitry 320 of level-shifter circuitry 30, in accordance with some examples of this disclosure. Level-shifter circuitry 30 includes switches 302A, 302B, 304A, 304B, 306A, 306B, 308A, 308B, 310A, and 310B. Set of switches 302A, 304A, 306A, 308A, and 310A may be electrically connected in series between floating voltage supply circuitry 44 and low-side voltage supply circuitry 40B. Set of switches 302B, 304B, 306B, 308B, and 310B may be electrically connected in series between floating voltage supply circuitry 44 and low-side voltage supply circuitry 40B.

Level-shifter circuitry 30 may receive control signals such as PDM signals and/or PWM signals at the control terminal of switch 310A. The control terminal of switch 310B may receive an inverted form of the control signals. In some examples, if the received control signal has a higher voltage level, set of switches 302A, 304A, 306A, 308A, and 310A may conduct electricity and set of switches 302B, 304B, 306B, 308B, and 310B may not conduct electricity. Whether the switches of level-shifter circuitry 30 conduct electricity may also be based on the voltage level of switch node 62 and the voltage level of floating voltage supply circuitry 44. Level-shifter circuitry 30 may generate control signals that are shifted at node(s) between switches 302A and 302B and switches 304A and 304B (see FIG. 7).

Biasing circuitry 10 is configured to deliver biasing signal 22A to the control terminals of switches 306A and 306B and to deliver biasing signal 22B to the control terminals of switches 308A and 308B. The control terminals of switches 306A and 306B are configured to receive biasing signal 22A. The control terminals of switches 308A and 308B are configured to receive biasing signal 22B.

Biasing signals 22A and 22B may cause the switches of cascode circuitry 320 to operate properly by conducting electricity when the other respective switches of level-shifter circuitry 30 conduct electricity. Biasing circuitry 10 may be configured to deliver biasing signals 22A and 22B at appropriate voltage levels. Biasing circuitry 10 may be configured to adjust the voltage levels of biasing signals 22A and 22B based on changes to the voltage level of floating voltage supply circuitry 44. In some examples, biasing circuitry 10 may be configured to respond quickly to changes in the voltage level of floating voltage supply circuitry 44 in order to reduce the likelihood of breakdown of the switches of level-shifter circuitry 30. In particular, switches 304A, 304B, 310A, and 310B and blocking diodes 52A and 52B may be exposed to larger voltage ranges.

Cascode circuitry 320 may be configured to reduce the voltage stress (e.g., drain-source voltage stress) on each of the switches of level-shifter circuitry 30. FIG. 7 depicts cascode circuitry 320 including an n-channel switch on the high side and a p-channel switch on the low side. In some examples, each cascode of cascode circuitry 320 may include two n-channel switches, two p-channel switches, or any other combination. In some examples, cascode circuitry 320 may include more than one cascode in each stack to further reduce the voltage stress on the switches.

There are several possible arrangements for designing level-shifter circuitry that will be exposed to larger voltage ranges, such as capacitance-based level shifting, transformer-based level shifting, and cascode circuitry. Capacitance- and transformer-based level shifting and may transform a square waveform into a series of pulses, either single-ended or differential. The pulses may refresh the stage of the gate driver in order to prevent false triggering due to noise. The repetition rate may be based on application conditions like switching frequency and duty cycle and may translate in sub-nanosecond requirements. This arrangement may result in high current consumption. Cascode circuitry 320 may be robust but also slower due to the stacking of switches 306A, 306B, 308A, and 308B, as compared to capacitance- and transformer-based level shifting.

FIGS. 9A and 9B are circuit diagrams of example diodes 12A and 12B of biasing circuitry 10, in accordance with some examples of this disclosure. Example configuration of diodes 12A includes four diodes 334A-334D. Example configuration of diodes 12B includes twelve diodes 340A-340L. Both configurations 12A and 12B include high-side biasing resistor 42A and low-side biasing resistor 42B. Configuration 12B may also include biasing resistors 342A and 342B. One or both of configurations 12A and 12B may include capacitor 330 to allow higher-frequency changes in the voltage level of floating voltage supply circuitry 44 to pass through high-side biasing resistor 42A. Capacitor 330 may be configured to operate as a high-frequency bypass to speed up the settling time for the voltage level of node 332 during changes in the voltage level of floating voltage supply circuitry 44. Capacitor 330 may be referred to as a bootstrap capacitor and may be electrically connected in parallel with biasing resistor 42A.

Node 332 may have a voltage level that is approximately halfway between the voltage levels of floating voltage supply circuitry 44 and low-side voltage supply circuitry 40B. Node 344A may have a voltage level that is approximately halfway between the voltage levels of floating voltage supply circuitry 44 and node 332. Node 344B may have a voltage level that is approximately halfway between the voltage levels of node 332 and floating voltage supply circuitry 44. Nodes 332, 344A, and 344B may provide voltage levels for generating intermediate voltage signal 18 and/or voltage signals 20A and 20B. Diodes 12A and 12B, along with biasing resistors 42A, 42B, 342A, and 342B, may function as a voltage divider to deliver appropriate voltage signals at nodes 332, 344A, and 344B. Configuration 12B may be configured to deliver biasing signals for three levels of cascode circuitry in level-shifter circuitry.

Figure 10:
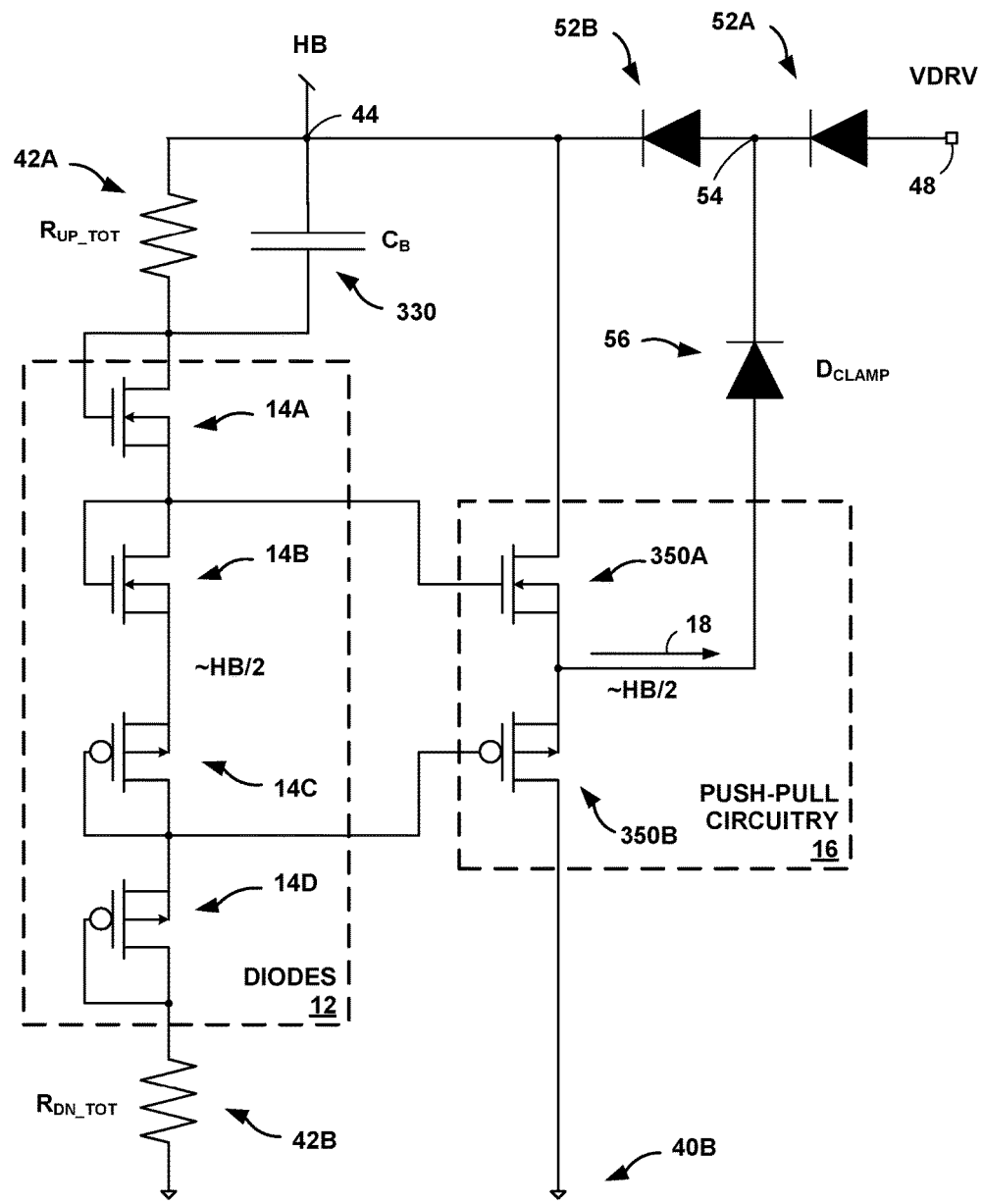
FIG. 10 is a circuit diagram of an example configuration of the device of FIGS. 1-3 and 7 including at least two blocking diodes, in accordance with some examples of this disclosure.

FIG. 10 is a circuit diagram of an example configuration of device 2 including at least two blocking diodes 52A and 52B, in accordance with some examples of this disclosure. As described with respect to FIG. 3, blocking diodes 52A and 52B may be configured to deliver a voltage signal from the auxiliary voltage supply circuitry 48 to floating voltage supply circuitry 44. Push-pull circuitry 16 is further configured to deliver intermediate voltage signal 18 through clamping diode 56 to intermediate node 54 between blocking diodes 52A and 52B.

Push-pull circuitry 16 may include high-side switch 350A and low-side switch 350B. When the voltage level of floating voltage supply circuitry 44 increases, the voltage level at the control terminal of high-side switch 350A may increase, causing high-side switch 350A to conduct electricity, thereby increasing the voltage level of intermediate voltage signal 18. When the voltage level of floating voltage supply circuitry 44 decreases, the voltage level at the control terminal of low-side switch 350B may decrease, causing low-side switch 350B to conduct electricity, thereby decreasing the voltage level of intermediate voltage signal 18.

Device 2 may be configured to include more than two blocking diodes to reduce the voltage stress on the blocking diodes. However, intermediate node 54 may not be controlled. Due to dynamic effects and impedance mismatch, the voltage stress may not always be equally distributed among blocking diodes 52A and 52B. Instead, the voltage stress on one or more of the blocking diodes may exceed the breakdown voltage level.

Figure 11:
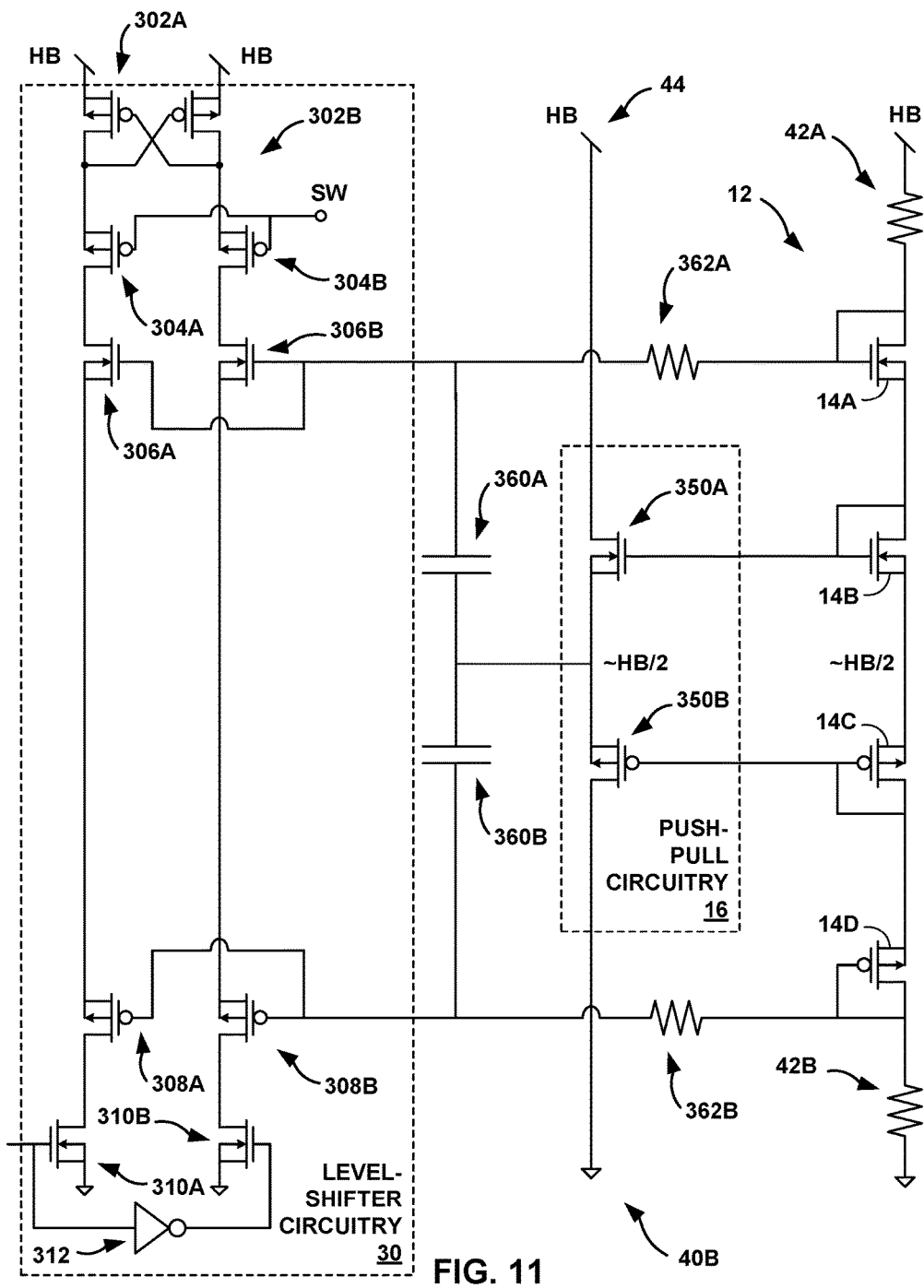
FIG. 11 is a circuit diagram of example biasing circuitry and example level-shifter circuitry of the device of FIGS. 1-3, 7, and 10, in accordance with some examples of this disclosure.
Figure 12:
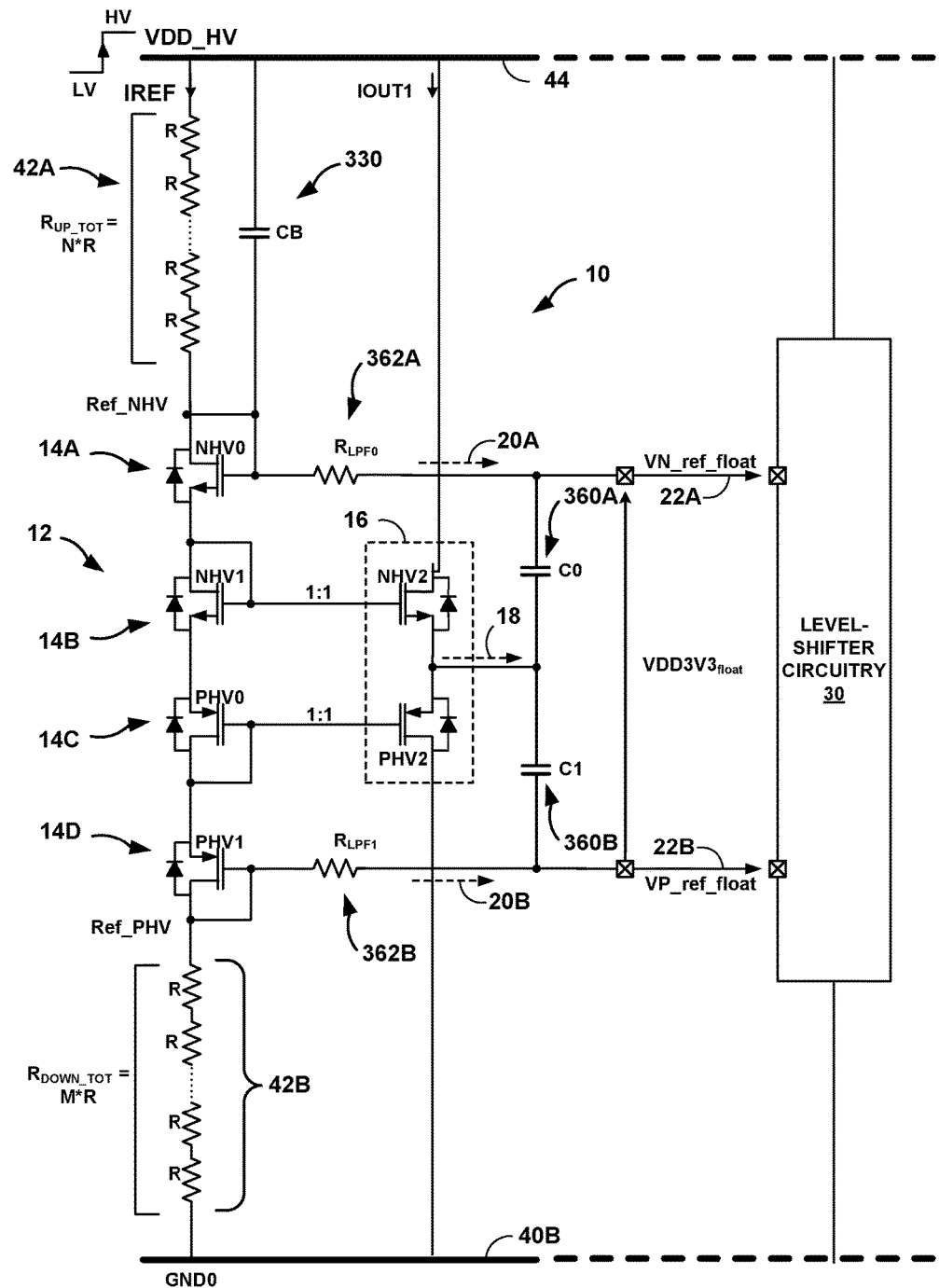
FIG. 12 is a circuit diagram of example biasing circuitry of the device of FIGS. 1-3, 7, 10, and 11, in accordance with some examples of this disclosure.

FIGS. 11 and 12 are circuit diagrams of example biasing circuitry 10 and example level-shifter circuitry 30, in accordance with some examples of this disclosure. In other devices, parasitic capacitances attached to the internal nodes of biasing circuitry may slow down the response to changes in the voltage level of floating voltage supply circuitry, such that one or more cascode devices of level-shifter circuitry may be exposed to voltages that are higher than the breakdown limit. In order to prevent breakdown, biasing circuitry 10 may include a fast AC bypass path, represented by push-pull circuitry 16, high-side capacitor 360A, and low-side capacitor 360B. Push-pull circuitry 16 may be configured to deliver intermediate voltage signal 18 to capacitors 360A and 360B. Biasing circuitry 10 may be configured to deliver biasing signals 22A and 22B based on intermediate voltage signal 18 delivered to capacitors 360A and 360B.

In particular, capacitors 360A and 360B may be configured to block a DC component of intermediate voltage signal 18 and allow an AC component of intermediate voltage signal 18 to pass. The filtered version of intermediate voltage signal 18 may combine with the filtered version of voltage signals 20A and 20B to generate biasing signals 22A and 22B.

The control terminals of switches 306A, 306B, 308A, and 308B may not be electrically connected directly to the DC bias leg (i.e., diodes 12). Instead, filter resistors 362A and 362B may be connected between diodes 14A and 14D and the control terminals of switches 306A, 306B, 308A, and 308B. Capacitors 360A and 360B may be configured to provide a fast charge/discharge path during transient conditions on floating voltage supply circuitry 44. The response to transients can be tailored by adjusting the sizes of switches 350A and 350B to operate at appropriate speeds. Biasing circuitry 10 may be configured to deliver biasing signals 22A and 22B to level-shifter circuitry 30 based on voltage signals 20A and 20B received from filter resistors 362A and 362B. Filter resistors 362A and 362B and capacitors 360A and 360B may be configured to operate as a high-pass filler for intermediate voltage signal 18 and a low-pass filter for voltage signals 20A and 20B.

Once the fast charge/discharge phase driven by push-pull circuitry 16 is finished, the settling time of biasing signals 22A and 22B may depend on the characteristics of biasing resistor 42A and bootstrap capacitor 330. As shown in FIG. 12, biasing resistors 42A and 42B may include more than one resistor connected in series. In some examples, there may be a tradeoff between static current consumption of the DC-biasing leg (diodes 12) and push-pull circuitry 16, and the desired settling speed of biasing signals 22A and 22B. Biasing circuitry 10 may operate in an open loop, such that compensation may not be necessary, which is beneficial for the speed of the floating voltage references (i.e., biasing signals 22A and 22B).

Figure 13:
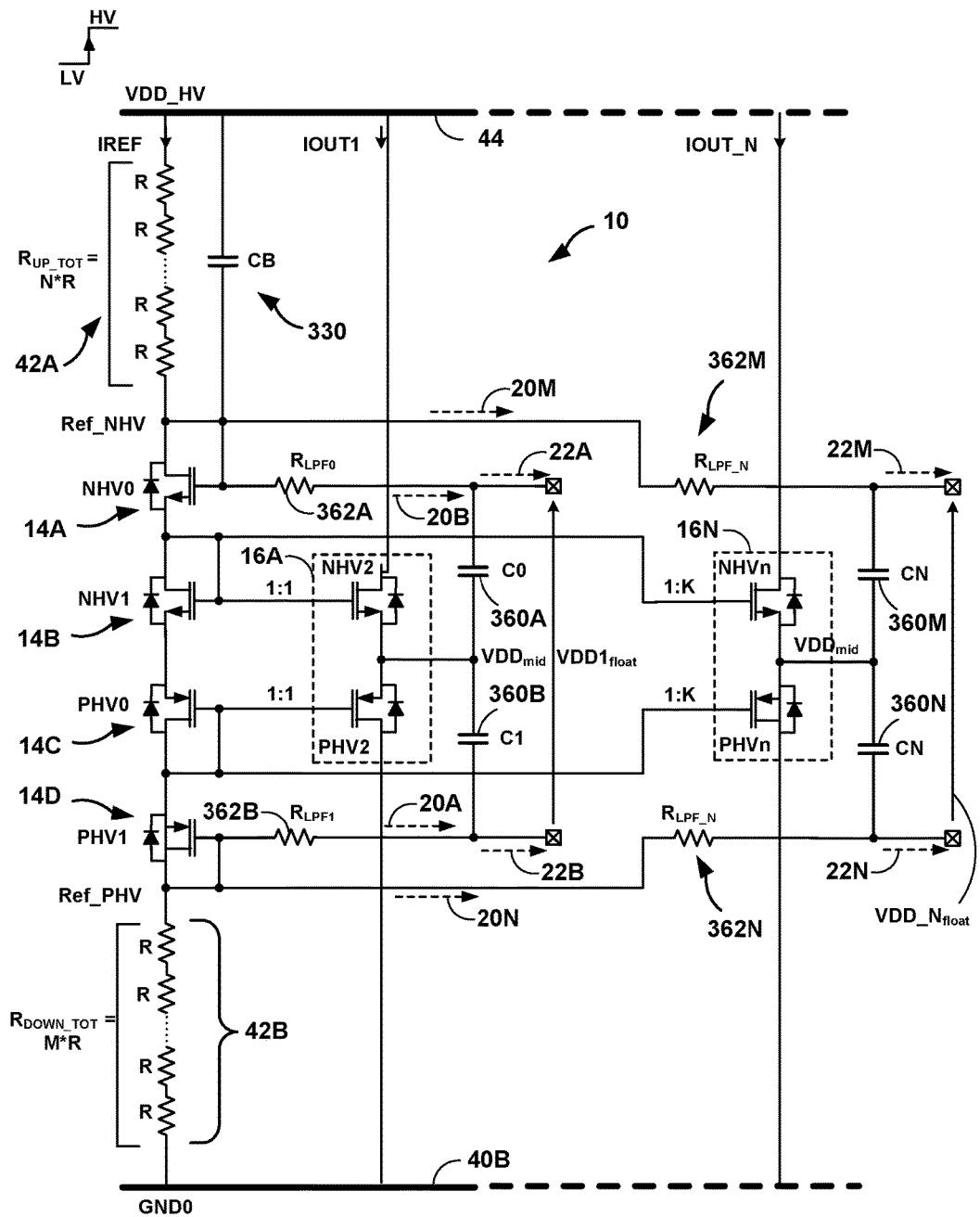
FIG. 13 is a circuit diagram of example biasing circuitry of the device of FIGS. 1-3, 7, and 10-12, in accordance with some examples of this disclosure.

FIG. 13 is a circuit diagram of example biasing circuitry 10, in accordance with some examples of this disclosure. Biasing circuitry 10 may offer modularity, such that biasing circuitry 10 may be configured to support several sets of level-shifter circuitry at the same time without much increase in complexity. For example, diodes 12 may deliver voltage signals 20A, 20B, 20M, and 20N to filter resistors 362A, 362B, 362M, and 362N. Biasing circuitry 10 may include push-pull circuitry 16 to improve the response time of biasing signals 22A, 22B, 22M, and 22N.

Biasing circuitry 10 may include more than push-pull circuitry 16A and 16N, where each of push-pull circuitry 16A and 16N is electrically connected to diodes 12 and configured to generate one of intermediate voltage signals 18A and 18N. Biasing circuitry 10 may be configured to deliver high-side biasing signals 22A and 22M and low-side biasing signals 22B and 22N.

Figure 14:
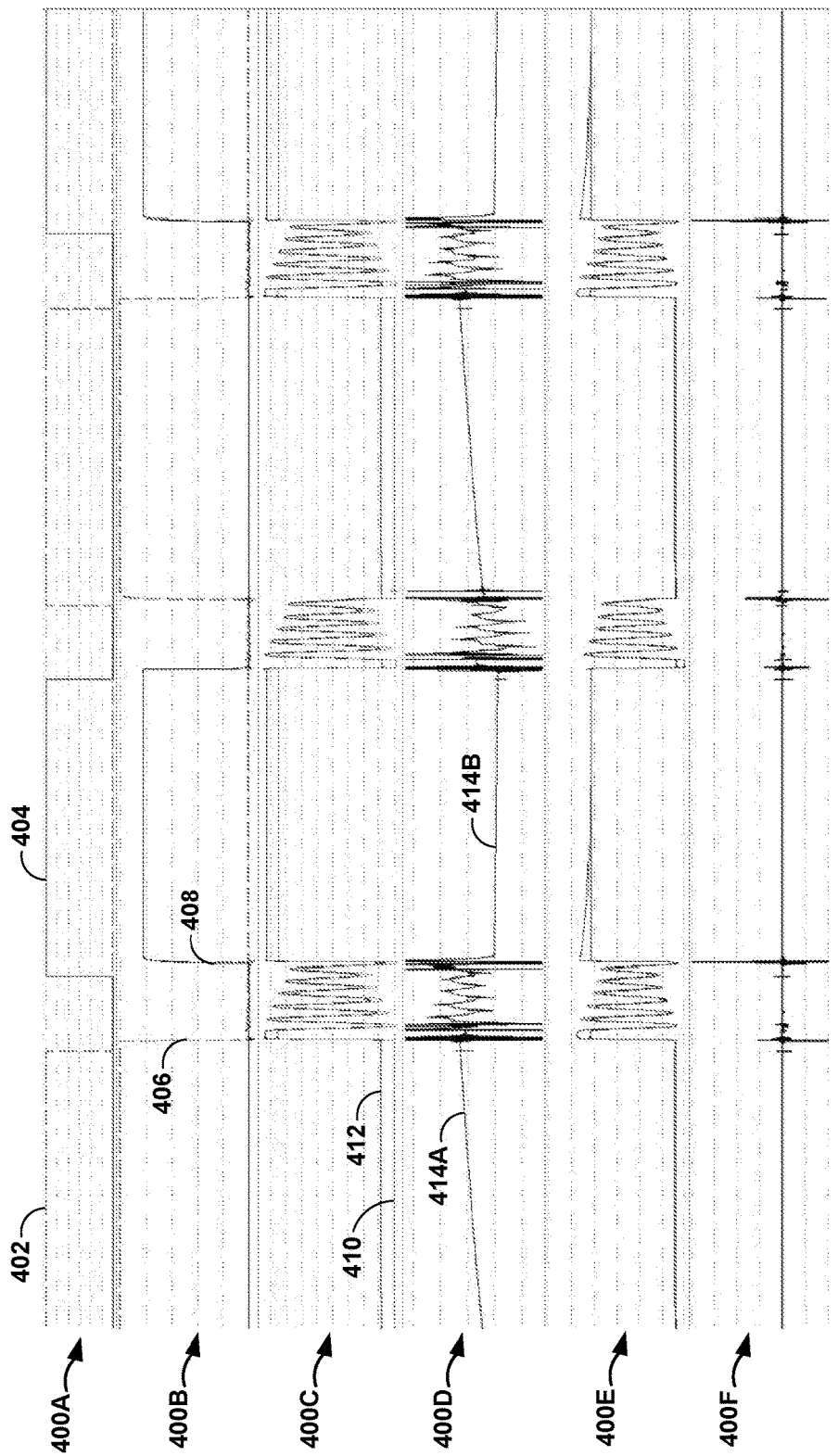
FIG. 14 is a graph of the example operation of the device of FIGS. 1-3, 7, and 10-13, in accordance with some examples of this disclosure.

FIG. 14 depicts graphs of the example operation of device 2, in accordance with some examples of this disclosure. In some examples, graphs 400A-400B may represent testing of device 2 with maximum voltage levels of floating voltage supply circuitry 244 of FIG. 6 up to one hundred and twenty volts. The voltage level of high-side voltage supply circuitry may be approximately one hundred volts for a gate driver for a power switch. The maximum capability of the device in the testing may be one hundred and forty volts for epi-to-substrate breakdown voltage. The testing lasted one thousand hours without failure of any components.

Graph 400A depicts control signals for power switches 260A and 260B. Graph 400B depicts the voltage levels at the control terminals for power switches 260A and 260B of FIG. 6. During a first time period when signals 402 and 406 are high, low-side power switch 260B may be conducting electricity. During a second time period when signals 404 and 408 are high, high-side power switch 260A may be conducting electricity. There may be dead time between the first time period and the second time period. Signal 406 represents the voltage difference of the control terminal of low-side power switch 260B and low-side voltage circuitry 240B, and signal 408 represents the voltage difference of the control terminal of high-side power switch 260A and switch node 262. Graph 400C depicts how the voltage level at floating voltage supply circuitry 244 tracks the voltage level at switch node 262. The signal 410 represents the voltage level at switch node 262, and signal 412 represents the voltage level of floating voltage supply circuitry 244.

Graph 400D depicts voltage difference between floating voltage supply circuitry 244 and switch node 262, which may be equal to the voltage across bootstrap capacitor 264. During time period 414A, bootstrap capacitor 264 is recharging while high-side power switch 260A is inactive. Auxiliary voltage supply circuitry 248 may recharge bootstrap capacitor 264 through blocking diodes 52A and 52B (see FIG. 7) during time period 414A. When high-side power switch 260A turns on, bootstrap capacitor 264 may quickly discharge by delivering electrical charge to the control terminal of high-side power switch 260A through floating voltage supply circuitry 244 and high-side gate driver 270A.

Graph 400E depicts very tight overlap between an ideal case of intermediate voltage signal 18 and a test case of intermediate voltage signal 18, referring to FIGS. 2-3. The light overlap may mean that biasing circuitry 10 behaves nearly ideally by delivering dynamic biasing signals 22A and 22B that respond to changes in the voltage level of floating voltage supply circuitry 44. The devices of level-shifter circuitry 30 may not experience excessive voltage stress during transient conditions. Graph 400F depicts the voltage level of high-side voltage supply circuitry, which includes pulses during the switch-on and switch-off transitions.

In some examples, the specifications for the testing shown in graphs 400A-400F for a buck conversion circuit includes: input voltage of one hundred volts, output current of 21.5 amperes, output voltage of 15.7 volts, and power of 337 watts. The buck conversion circuit may include a half-bridge configuration or an H-bridge configuration with a transformer in the middle. The test device included an integrated quad flat, non-leaded (IQFN) package. In some examples, the test device could include a LLC28 package. The techniques of this disclosures may also be used in silicon on insulator devices or high-voltage isolation devices, or in applications such as solar or telecommunications.

Figure 15:
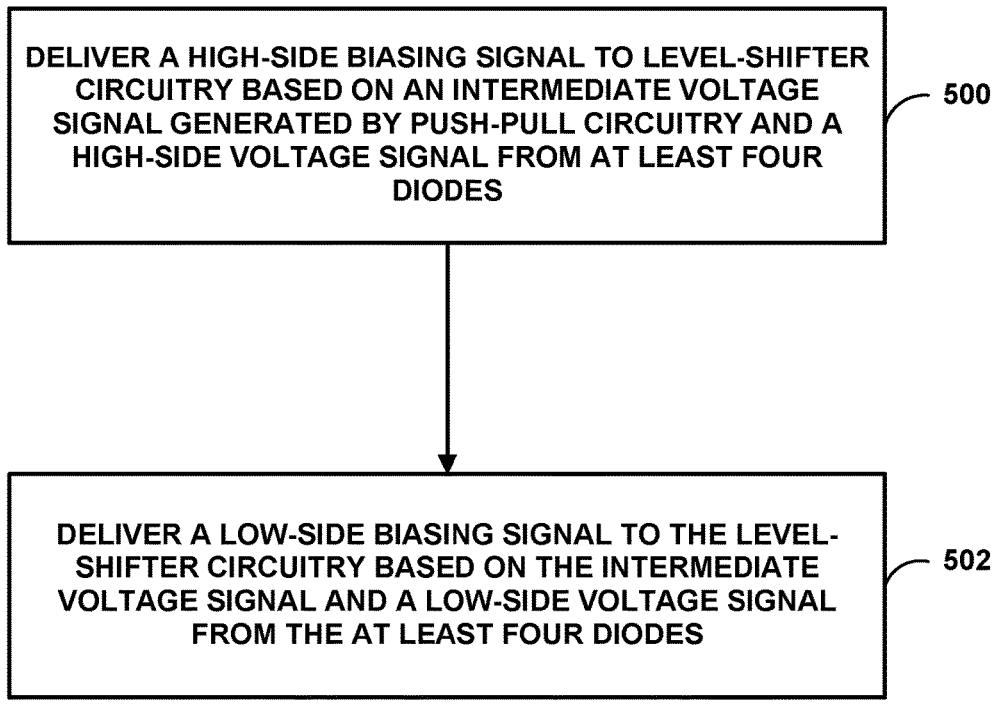
FIG. 15 is a flowchart illustrating a technique for delivering biasing signals to level-shifter circuitry, in accordance with some examples of this disclosure.

FIG. 15 is a flowchart illustrating a technique 200 for delivering biasing signals to level-shifter circuitry, in accordance with some examples of this disclosure. Technique 200 is described with reference to device 2 in FIGS. 1-3, 7, and 10-13, although other components, such as the circuitry of in FIGS. 9A and 9B, may exemplify similar techniques.

The technique of FIG. 15 includes delivering biasing signal 22A to level-shifter circuitry 30 based on intermediate voltage signal 18 generated by push-pull circuitry 16 electrically connected to diodes 12, and further based on voltage signal 20A from diodes 12, wherein each diode of diodes 12 is electrically connected in series (500). Diodes 12 may be configured to deliver voltage signal 20A through filter resistor 362A. Push-pull circuitry 16 may be configured to deliver intermediate voltage signal 18 to high-side capacitor 360A. Biasing circuitry 10 may be configured to deliver biasing signal 22A to a control terminal of switches 306A and 306B. Biasing signal 22A may respond quickly to changes in the voltage level of floating voltage supply circuitry 44 such that switches 306A and 306B experience lower voltage stress, as compared to switches of another device.

The technique of FIG. 15 also includes delivering biasing signal 22B to level-shifter circuitry 30 based on intermediate voltage signal 18 and voltage signal 20B from diodes 12 (502). Diodes 12 may be configured to deliver voltage signal 20B through filter resistor 362B. Push-pull circuitry 16 may be configured to deliver intermediate voltage signal 18 to low-side capacitor 360B. Biasing circuitry 10 may be configured to deliver biasing signal 22B to a control terminal of switches 308A and 308B, such that switches 308A and 308B experience lower voltage stress, as compared to switches of another device.

The following numbered examples demonstrate one or more aspects of the disclosure.

Example 1

A device including level-shifter circuitry and biasing circuitry including at least four diodes, wherein each diode of the at least four diodes is electrically connected in series. The biasing circuitry further includes push-pull circuitry electrically connected to at least two diodes of the at least four diodes and configured to generate an intermediate voltage signal. The biasing circuitry is configured to deliver a high-side biasing signal to the level-shifter circuitry based on the intermediate voltage signal and a high-side voltage signal from the at least four diodes. The biasing circuitry is further configured to deliver a low-side biasing signal to the level-shifter circuitry based on the intermediate voltage signal and a low-side voltage signal from the at least four diodes.

Example 2

The device of example 1, wherein the biasing circuitry further includes a high-side capacitor and a low-side capacitor, wherein the push-pull circuitry is further configured to deliver the intermediate voltage signal to the high-side capacitor and the low-side capacitor. The biasing circuitry is also configured to deliver the high-side biasing signal based on the intermediate voltage signal delivered to the high-side capacitor. The biasing circuitry is further configured to deliver the low-side biasing signal based on the intermediate voltage signal delivered to the low-side capacitor.

Example 3

The device of examples 1-2 or any combination thereof, wherein the biasing circuitry further includes a high-side filter resistor electrically connected to the at least four diodes and the high-side capacitor. The biasing circuitry further includes a low-side filter resistor electrically connected to the at least four diodes and the low-side capacitor. The biasing circuitry is further configured to deliver the high-side biasing signal to the level-shifter circuitry based on the high-side voltage signal received from the high-side filter resistor. The biasing circuitry is also configured to deliver the low-side biasing signal to the level-shifter circuitry based on the low-side voltage signal received from the low-side filter resistor.

Example 4

The device of examples 1-3 or any combination thereof, wherein the level-shifter circuitry is first level-shifter circuitry, the push-pull circuitry is first push-pull circuitry, the intermediate voltage signal is a first intermediate voltage signal, the high-side biasing signal is a first high-side biasing signal, the low-side biasing signal is a first low-side biasing signal, the high-side voltage signal is a first high-side voltage signal, and the low-side voltage signal is a first low-side voltage signal. The device further includes second level-shifter circuitry, wherein the biasing circuitry further includes second push-pull circuitry electrically connected to the at least two diodes of the at least four diodes and configured to generate a second intermediate voltage signal. The biasing circuitry is further configured to deliver a second high-side biasing signal to the second level-shifter circuitry based on the second intermediate voltage signal and a second high-side voltage signal from the at least four diodes. The biasing circuitry is also configured to deliver a second low-side biasing signal to the second level-shifter circuitry based on the second intermediate voltage signal and a second low-side voltage signal from the at least four diodes.

Example 5

The device of examples 1-4 or any combination thereof, further including a first high-side capacitor, a first low-side capacitor, a second high-side capacitor, and a second low-side capacitor. The first push-pull circuitry is further configured to deliver the first intermediate voltage signal to the first high-side capacitor and the first low-side capacitor. The biasing circuitry is configured to deliver the first high-side biasing signal based on the first intermediate voltage signal delivered to the first high-side capacitor. The biasing circuitry is configured to deliver the first low-side biasing signal based on the first intermediate voltage signal delivered to the first low-side capacitor. The second push-pull circuitry is further configured to deliver the second intermediate voltage signal to the second high-side capacitor and the second low-side capacitor. The biasing circuitry is also configured to deliver the second high-side biasing signal based on the second intermediate voltage signal delivered to the second high-side capacitor. The biasing circuitry is configured to deliver the second low-side biasing signal based on the second intermediate voltage signal delivered to the second low-side capacitor.

Example 6

The device of examples 1-5 or any combination thereof, further including floating voltage supply circuitry and low-side voltage supply circuitry. The biasing circuitry further includes at least one high-side biasing resistor electrically connected in series between the floating voltage supply circuitry and the at least four diodes. The biasing circuitry further includes at least one low-side biasing resistor electrically connected in series between the at least four diodes and the low-side voltage supply circuitry.

Example 7

The device of examples 1-6 or any combination thereof, further including auxiliary voltage supply circuitry, a clamping diode, and at least two blocking diodes electrically connected in series between the auxiliary voltage supply circuitry and the floating voltage supply circuitry. The at least two blocking diodes are configured to deliver a voltage signal from the auxiliary voltage supply circuitry to the floating voltage supply circuitry. The push-pull circuitry is further configured to deliver the intermediate voltage signal through the clamping diode to an intermediate node of the at least two blocking diodes.

Example 8

The device of examples 1-7 or any combination thereof, wherein the level-shifter circuitry includes a first set of switches electrically connected in series between the floating voltage supply circuitry and the low-side voltage supply circuitry, wherein the first set of switches includes first cascode circuitry configured to receive the high-side biasing signal and the low-side biasing signal. The level-shifter circuitry further includes a second set of switches electrically connected in series between the floating voltage supply circuitry and the low-side voltage supply circuitry, wherein the second set of switches includes second cascode circuitry configured to receive the high-side biasing signal and the low-side biasing signal.

Example 9

The device of examples 1-8 or any combination thereof, wherein the first cascode circuitry includes a first high-side switch and a first low-side switch, wherein the second cascode circuitry includes a second high-side switch and a second low-side switch. A control terminal of the first high-side switch and a control terminal of the second high-side switch are configured to receive the high-side biasing signal, and a control terminal of the first low-side switch and a control terminal of the second low-side switch are configured to receive the low-side biasing signal.

Example 10

The device of examples 1-9 or any combination thereof, wherein a voltage difference between the intermediate voltage signal and the low-side voltage supply circuitry is approximately one-half of a voltage difference between the floating voltage supply circuitry and the low-side voltage supply circuitry.

Example 11

The device of examples 1-10 or any combination thereof, wherein the biasing circuitry further includes a bootstrap capacitor electrically connected in parallel with the at least one high-side biasing resistor.

Example 12

The device of examples 1-11 or any combination thereof, wherein each diode of the at least four diodes is a diode-connected metal-oxide-semiconductor transistor.

Example 13

The device of examples 1-12 or any combination thereof, further including half-bridge circuitry including a high-side power switch and a low-side power switch, wherein the high-side power switch and the low-side power switch are electrically connected by a switch node. The device further includes gate driver circuitry configured to deliver control signals to a control terminal of the high-side power switch based on shifted pulse-width modulated signals received from the level-shifter circuitry.

Example 14

A method for biasing level-shifter circuitry includes delivering a high-side biasing signal to level-shifter circuitry based on an intermediate voltage signal generated by push-pull circuitry electrically connected to at least four diodes, and further based on a high-side voltage signal from the at least four diodes, wherein each diode of the at least four diodes is electrically connected in series. The method further includes delivering a low-side biasing signal to the level-shifter circuitry based on the intermediate voltage signal and a low-side voltage signal from the at least four diodes.

Example 15

The method of example 14, wherein delivering the high-side biasing signal to the level-shifter circuitry is based on the intermediate voltage signal delivered to a high-side capacitor and further based on the high-side voltage signal received from a high-side filter resistor electrically connected to the at least four diodes and the high-side capacitor. Delivering the low-side biasing signal to the level-shifter circuitry is based on the intermediate voltage signal delivered to a low-side capacitor and further based on the low-side voltage signal received from a low-side filter resistor electrically connected to the at least four diodes and the low-side capacitor.

Example 16

The method of examples 14-15 or any combination thereof, wherein the level-shifter circuitry is first level-shifter circuitry, the push-pull circuitry is first push-pull circuitry, the intermediate voltage signal is a first intermediate voltage signal, the high-side biasing signal is a first high-side biasing signal, the low-side biasing signal is a first low-side biasing signal, the high-side voltage signal is a first high-side voltage signal, and the low-side voltage signal is a first low-side voltage signal. The method further includes delivering a second high-side biasing signal to second level-shifter circuitry based on a second intermediate voltage signal generated by second push-pull circuitry electrically connected to the at least four diodes, and further based on a second high-side voltage signal from the at least four diodes. The method further includes delivering a second low-side biasing signal to the second level-shifter circuitry based on the second intermediate voltage signal and a second low-side voltage signal from the at least four diodes.

Example 17

The method of examples 14-16 or any combination thereof, further including delivering the intermediate voltage signal through a clamping diode to an intermediate node of at least two blocking diodes. The at least two blocking diodes are electrically connected between auxiliary voltage supply circuitry and floating voltage supply circuitry. The at least two blocking diodes are configured to deliver a voltage signal to the floating voltage supply circuitry. The floating voltage supply circuitry is electrically connected to the level-shifting circuitry.

Example 18

The method of examples 14-17 or any combination thereof, wherein delivering the high-side biasing signal includes delivering the high-side biasing signal to a first high-side switch of first cascode circuitry of a first set of switches of the level-shifter circuitry and a second high-side switch of second cascode circuitry of a second set of switches of the level-shifter circuitry. Delivering the low-side biasing signal includes delivering the low-side biasing signal to a first low-side switch of the first cascode circuitry and a second low-side switch of the second cascode circuitry.

Example 19

A device comprising a single semiconductor die including half-bridge circuitry including a high-side power switch and a low-side power switch, wherein the high-side power switch and the low-side power switch are electrically connected by a switch node. The single semiconductor die further includes level-shifter circuitry and gate driver circuitry configured to deliver control signals to a control terminal of the high-side power switch based on shifted pulse-width modulated signals received from the level-shifter circuitry. The single semiconductor die also includes biasing circuitry including at least four diodes, wherein each diode of the at least four diodes is electrically connected in series. The biasing circuitry further includes a high-side capacitor, a low-side capacitor, and push-pull circuitry electrically connected to at least two diodes of the at least four diodes and configured to deliver an intermediate voltage signal to the high-side capacitor and the low-side capacitor. The biasing circuitry is configured to deliver a high-side biasing signal to the level-shifter circuitry based on the intermediate voltage signal delivered to the high-side capacitor and further based on a high-side voltage signal from the at least four diodes. The biasing circuitry is further configured to deliver a low-side biasing signal to the level-shifter circuitry based on the intermediate voltage signal delivered to the low-side capacitor and further based on a low-side voltage signal from the at least four diodes.

Example 20

The device of example 19, wherein the single semiconductor die further includes floating voltage supply circuitry, auxiliary voltage supply circuitry, at least two blocking diodes electrically connected in series between the auxiliary voltage supply circuitry and the floating voltage supply circuitry, wherein the at least two blocking diodes are configured to deliver a voltage signal from the auxiliary voltage supply circuitry to the floating voltage supply circuitry. The single semiconductor die further includes a clamping diode, wherein the push-pull circuitry is further configured to deliver the intermediate voltage signal through the clamping diode to an intermediate node of the at least two blocking diodes.

Various examples of the disclosure have been described. Any combination of the described systems, operations, or functions is contemplated. These and other examples are within the scope of the following claims.

What is claimed is:
1. A device comprising:
level-shifter circuitry; and
biasing circuitry comprising:
at least four diodes, wherein each diode of the at least four diodes is electrically connected in series; and
push-pull circuitry electrically connected to at least two diodes of the at least four diodes and configured to generate an intermediate voltage signal, wherein the biasing circuitry is configured to:

deliver a high-side biasing signal to the level-shifter circuitry based on the intermediate voltage signal and a high-side voltage signal from the at least four diodes, and deliver a low-side biasing signal to the level-shifter circuitry based on the intermediate voltage signal and a low-side voltage signal from the at least four diodes.

2. The device of claim 1, wherein the biasing circuitry further comprises:
a high-side capacitor; and
a low-side capacitor,
wherein the push-pull circuitry is further configured to deliver the intermediate voltage signal to the high-side capacitor and the low-side capacitor,
wherein the biasing circuitry is configured to deliver the high-side biasing signal based on the intermediate voltage signal delivered to the high-side capacitor, and
wherein the biasing circuitry is configured to deliver the low-side biasing signal based on the intermediate voltage signal delivered to the low-side capacitor.

3. The device of claim 2, wherein the biasing circuitry further comprises:
a high-side filter resistor electrically connected to the at least four diodes and the high-side capacitor; and
a low-side filter resistor electrically connected to the at least four diodes and the low-side capacitor,
wherein the biasing circuitry is configured to deliver the high-side biasing signal to the level-shifter circuitry based on the high-side voltage signal received from the high-side filter resistor, and
wherein the biasing circuitry is configured to deliver the low-side biasing signal to the level-shifter circuitry based on the low-side voltage signal received from the low-side filter resistor.

4. The device of claim 1, wherein the level-shifter circuitry is first level-shifter circuitry, wherein the push-pull circuitry is first push-pull circuitry, wherein the intermediate voltage signal is a first intermediate voltage signal, wherein the high-side biasing signal is a first high-side biasing signal, wherein the low-side biasing signal is a first low-side biasing signal, wherein the high-side voltage signal is a first high-side voltage signal, and wherein the low-side voltage signal is a first low-side voltage signal, the device further comprising second level-shifter circuitry,
wherein the biasing circuitry further comprises second push-pull circuitry electrically connected to the at least two diodes of the at least four diodes and configured to generate a second intermediate voltage signal,
wherein the biasing circuitry is further configured to:
deliver a second high-side biasing signal to the second level-shifter circuitry based on the second intermediate voltage signal and a second high-side voltage signal from the at least four diodes, and
deliver a second low-side biasing signal to the second level-shifter circuitry based on the second intermediate voltage signal and a second low-side voltage signal from the at least four diodes.

5. The device of claim 4, further comprising a first high-side capacitor, a first low-side capacitor, a second high-side capacitor, and a second low-side capacitor,
wherein the first push-pull circuitry is further configured to deliver the first intermediate voltage signal to the first high-side capacitor and the first low-side capacitor, wherein the biasing circuitry is configured to deliver the first high-side biasing signal based on the first intermediate voltage signal delivered to the first high-side capacitor,
wherein the biasing circuitry is configured to deliver the first low-side biasing signal based on the first intermediate voltage signal delivered to the first low-side capacitor,
wherein the second push-pull circuitry is further configured to deliver the second intermediate voltage signal to the second high-side capacitor and the second low-side capacitor,
wherein the biasing circuitry is configured to deliver the second high-side biasing signal based on the second intermediate voltage signal delivered to the second high-side capacitor, and
wherein the biasing circuitry is configured to deliver the second low-side biasing signal based on the second intermediate voltage signal delivered to the second low-side capacitor.

6. The device of claim 1, further comprising floating voltage supply circuitry and low-side voltage supply circuitry, wherein the biasing circuitry further comprises:
at least one high-side biasing resistor electrically connected in series between the floating voltage supply circuitry and the at least four diodes; and
at least one low-side biasing resistor electrically connected in series between the at least four diodes and the low-side voltage supply circuitry.

7. The device of claim 6, further comprising:
auxiliary voltage supply circuitry;
a clamping diode; and
at least two blocking diodes electrically connected in series between the auxiliary voltage supply circuitry and the floating voltage supply circuitry, wherein the at least two blocking diodes are configured to deliver a voltage signal from the auxiliary voltage supply circuitry to the floating voltage supply circuitry,
wherein the push-pull circuitry is further configured to deliver the intermediate voltage signal through the clamping diode to an intermediate node of the at least two blocking diodes.

8. The device of claim 6, wherein the level-shifter circuitry comprises:
a first set of switches electrically connected in series between the floating voltage supply circuitry and the low-side voltage supply circuitry, wherein the first set of switches includes first cascode circuitry configured to receive the high-side biasing signal and the low-side biasing signal; and
a second set of switches electrically connected in series between the floating voltage supply circuitry and the low-side voltage supply circuitry, wherein the second set of switches includes second cascode circuitry configured to receive the high-side biasing signal and the low-side biasing signal.

9. The device of claim 8, wherein the first cascode circuitry comprises a first high-side switch and a first low-side switch, wherein the second cascode circuitry comprises a second high-side switch and a second low-side switch, wherein a control terminal of the first high-side switch and a control terminal of the second high-side switch are configured to receive the high-side biasing signal, and wherein a control terminal of the first low-side switch and a control terminal of the second low-side switch are configured to receive the low-side biasing signal.

10. The device of claim 6, wherein a voltage difference between the intermediate voltage signal and the low-side voltage supply circuitry is approximately one-half of a voltage difference between the floating voltage supply circuitry and the low-side voltage supply circuitry.

11. The device of claim 6, wherein the biasing circuitry further comprises a bootstrap capacitor electrically connected in parallel with the at least one high-side biasing resistor.

12. The device of claim 1, wherein each diode of the at least four diodes is a diode-connected metal-oxide-semiconductor transistor.

13. The device of claim 1, further comprising:
half-bridge circuitry comprising a high-side power switch and a low-side power switch, wherein a switch node is electrically connected between the high-side power switch and the low-side power switch;
gate driver circuitry configured to deliver control signals to a control terminal of the high-side power switch based on shifted pulse-width modulated signals received from the level-shifter circuitry.

14. A method for biasing level-shifter circuitry, the method comprising:
delivering a high-side biasing signal to level-shifter circuitry based on an intermediate voltage signal generated by push-pull circuitry electrically connected to at least four diodes, and further based on a high-side voltage signal from the at least four diodes, wherein each diode of the at least four diodes is electrically connected in series; and
delivering a low-side biasing signal to the level-shifter circuitry based on the intermediate voltage signal and a low-side voltage signal from the at least four diodes.

15. The method of claim 14,
wherein delivering the high-side biasing signal to the level-shifter circuitry is based on the intermediate voltage signal delivered to a high-side capacitor and further based on the high-side voltage signal received from a high-side filter resistor electrically connected to the at least four diodes and the high-side capacitor, and
wherein delivering the low-side biasing signal to the level-shifter circuitry is based on the intermediate voltage signal delivered to a low-side capacitor and further based on the low-side voltage signal received from a low-side filter resistor electrically connected to the at least four diodes and the low-side capacitor.

16. The method of claim 14, wherein the level-shifter circuitry is first level-shifter circuitry, wherein the push-pull circuitry is first push-pull circuitry, wherein the intermediate voltage signal is a first intermediate voltage signal, wherein the high-side biasing signal is a first high-side biasing signal, wherein the low-side biasing signal is a first low-side biasing signal, wherein the high-side voltage signal is a first high-side voltage signal, and wherein the low-side voltage signal is a first low-side voltage signal, the method further comprising:
delivering a second high-side biasing signal to second level-shifter circuitry based on a second intermediate voltage signal generated by second push-pull circuitry electrically connected to the at least four diodes, and further based on a second high-side voltage signal from the at least four diodes; and
delivering a second low-side biasing signal to the second level-shifter circuitry based on the second intermediate voltage signal and a second low-side voltage signal from the at least four diodes.

17. The method of claim 14, further comprising delivering the intermediate voltage signal through a clamping diode to an intermediate node of at least two blocking diodes,
wherein the at least two blocking diodes are electrically connected between auxiliary voltage supply circuitry and floating voltage supply circuitry, and
wherein the at least two blocking diodes are configured to deliver a voltage signal to the floating voltage supply circuitry,
wherein the floating voltage supply circuitry is electrically connected to the level-shifting circuitry.

18. The method of claim 14,
wherein delivering the high-side biasing signal comprises delivering the high-side biasing signal to a first high-side switch of first cascode circuitry of a first set of switches of the level-shifter circuitry and a second high-side switch of second cascode circuitry of a second set of switches of the level-shifter circuitry,
wherein delivering the low-side biasing signal comprises delivering the low-side biasing signal to a first low-side switch of the first cascode circuitry and a second low-side switch of the second cascode circuitry.

19. A device comprising a single semiconductor die including:
half-bridge circuitry comprising a high-side power switch and a low-side power switch, wherein the high-side power switch and the low-side power switch are electrically connected by a switch node;
level-shifter circuitry;
gate driver circuitry configured to deliver control signals to a control terminal of the high-side power switch based on shifted pulse-width modulated signals received from the level-shifter circuitry; and
biasing circuitry comprising:
at least four diodes, wherein each diode of the at least four diodes is electrically connected in series;
a high-side capacitor and a low-side capacitor;
push-pull circuitry electrically connected to at least two diodes of the at least four diodes and configured to deliver an intermediate voltage signal to the high-side capacitor and the low-side capacitor, wherein the biasing circuitry is configured to:
deliver a high-side biasing signal to the level-shifter circuitry based on the intermediate voltage signal delivered to the high-side capacitor and further based on a high-side voltage signal from the at least four diodes, and
deliver a low-side biasing signal to the level-shifter circuitry based on the intermediate voltage signal delivered to the low-side capacitor and further based on a low-side voltage signal from the at least four diodes.

20. The device of claim 19, wherein the single semiconductor die further includes:
floating voltage supply circuitry;
auxiliary voltage supply circuitry;
at least two blocking diodes electrically connected in series between the auxiliary voltage supply circuitry and the floating voltage supply circuitry, wherein the at least two blocking diodes are configured to deliver a voltage signal from the auxiliary voltage supply circuitry to the floating voltage supply circuitry; and
a clamping diode,
wherein the push-pull circuitry is further configured to deliver the intermediate voltage signal through the clamping diode to an intermediate node of the at least two blocking diodes.

* * * * *